(12) United States Patent
Onozawa

(10) Patent No.: US 10,403,554 B2
(45) Date of Patent: Sep. 3, 2019

(54) METHOD FOR MANUFACTURING SEMICONDUCTOR DEVICE

(71) Applicant: FUJI ELECTRIC CO., LTD., Kawasaki (JP)

(72) Inventor: Yuichi Onozawa, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 15/437,472

(22) Filed: Feb. 21, 2017

(65) Prior Publication Data

US 2017/0162458 A1 Jun. 8, 2017

Related U.S. Application Data

(63) Continuation of application No. PCT/JP2016/000464, filed on Jan. 29, 2016.

(30) Foreign Application Priority Data

Mar. 16, 2015 (JP) .................................. 2015-052594

(51) Int. Cl.
H01L 21/66 (2006.01)
H01L 29/739 (2006.01)
(Continued)

(52) U.S. Cl.
CPC ........ *H01L 22/20* (2013.01); *H01L 21/28525* (2013.01); *H01L 21/28556* (2013.01);
(Continued)

(58) Field of Classification Search
None
See application file for complete search history.

(56) References Cited

U.S. PATENT DOCUMENTS 4,851,363 A * 7/1989 Troxell ............... H01L 27/1214
438/151
5,130,264 A * 7/1992 Troxell ................... H01L 21/84
148/DIG. 150

(Continued)

FOREIGN PATENT DOCUMENTS

JP 2000-252450 9/2000
JP 2003100819 A1 * 4/2003
(Continued)

OTHER PUBLICATIONS

English translation of Tanaka (JP2013083143) 5pgs. Retrieved from the internet on Feb. 19, 2018: https://patents.google.com/patent/JP2013183143A/en?oq=2013183143.*
(Continued)

*Primary Examiner* — David E Graybill

(57) ABSTRACT

A method for manufacturing a semiconductor device includes: digging first and second trenches at the top surface of a plate-like base-body portion; forming an insulating film in the inside of each of the first and second trenches; laminating a conductive film on the top surface of the base-body portion so as to bury the first and second trenches with the conductive film via the insulating film; testing insulation-characteristics of the insulating film by applying a voltage between the conductive film and the bottom surface of the base-body portion; and after testing the insulation-characteristics, selectively removing the conductive film from the top surface of the base-body portion, so as to define a gate electrode in the first trench and an separated-electrode in the second trench, the separated-electrode being separated from the gate electrode.

12 Claims, 31 Drawing Sheets

(51) Int. Cl.
  *H01L 21/285* (2006.01)
  *H01L 29/06* (2006.01)
  *H01L 29/40* (2006.01)
  *H01L 29/66* (2006.01)
  *H01L 29/78* (2006.01)

(52) U.S. Cl.
  CPC .............. *H01L 22/14* (2013.01); *H01L 22/30* (2013.01); *H01L 29/0619* (2013.01); *H01L 29/401* (2013.01); *H01L 29/404* (2013.01); *H01L 29/407* (2013.01); *H01L 29/66348* (2013.01); *H01L 29/66734* (2013.01); *H01L 29/739* (2013.01); *H01L 29/7397* (2013.01); *H01L 29/7813* (2013.01); *H01L 22/34* (2013.01)

(56) References Cited

U.S. PATENT DOCUMENTS

| | | | | |
|---|---|---|---|---|
| 5,313,075 A * | | 5/1994 | Zhang | H01L 27/1214 257/57 |
| 5,329,142 A * | | 7/1994 | Kitagawa | H01L 29/7394 257/137 |
| 5,424,244 A * | | 6/1995 | Zhang | B60R 25/066 257/E21.141 |
| 5,448,083 A * | | 9/1995 | Kitagawa | H01L 29/7394 257/133 |
| 5,486,772 A * | | 1/1996 | Hshieh | G01R 31/2621 324/762.09 |
| 5,583,369 A * | | 12/1996 | Yamazaki | H01L 21/2026 257/635 |
| 5,585,651 A * | | 12/1996 | Kitagawa | H01L 29/7394 257/135 |
| 5,689,121 A * | | 11/1997 | Kitagawa | H01L 29/7394 257/135 |
| 5,696,386 A * | | 12/1997 | Yamazaki | H01L 21/2026 257/57 |
| 5,796,121 A * | | 8/1998 | Gates | H01L 29/78603 257/40 |
| 5,838,026 A * | | 11/1998 | Kitagawa | H01L 29/7394 257/124 |
| 5,894,149 A * | | 4/1999 | Uenishi | H01L 29/0653 257/129 |
| 5,946,561 A * | | 8/1999 | Yamazaki | H01L 21/2026 438/166 |
| 5,985,740 A * | | 11/1999 | Yamazaki | H01L 21/2022 438/486 |
| 5,990,542 A * | | 11/1999 | Yamazaki | G02F 1/1362 257/640 |
| 6,111,290 A * | | 8/2000 | Uenishi | H01L 29/0653 257/139 |
| 6,150,696 A * | | 11/2000 | Iwamatsu | H01L 21/84 257/347 |
| 6,218,217 B1 * | | 4/2001 | Uenishi | H01L 29/0653 257/129 |
| 6,251,235 B1 * | | 6/2001 | Talieh | H01L 21/2885 204/220 |
| 6,277,501 B1 * | | 8/2001 | Fujikawa | C30B 15/00 117/13 |
| 6,309,981 B1 * | | 10/2001 | Mayer | C23F 1/08 156/345.21 |
| 6,482,749 B1 * | | 11/2002 | Billington | C11D 7/06 257/E21.214 |
| 6,537,416 B1 * | | 3/2003 | Mayer | H01L 21/67051 118/729 |
| 6,563,174 B2 * | | 5/2003 | Kawasaki | H01L 29/4908 257/350 |
| 6,586,342 B1 * | | 7/2003 | Mayer | C23F 1/08 156/345.17 |
| 6,605,497 B2 * | | 8/2003 | Yamazaki | H01L 27/12 257/E21.413 |
| 6,815,265 B2 * | | 11/2004 | Nakatani | H01L 23/53295 257/529 |
| 6,890,805 B2 * | | 5/2005 | Yamazaki | H01L 27/12 257/E21.413 |
| 6,926,932 B2 * | | 8/2005 | Lin | C23C 16/24 427/255.27 |
| 6,979,649 B2 * | | 12/2005 | Arai | H01L 21/0206 257/E21.241 |
| 7,189,992 B2 * | | 3/2007 | Wager, III | H01L 29/02 257/43 |
| 7,250,365 B2 * | | 7/2007 | Arai | H01L 21/0206 257/E21.237 |
| 7,339,187 B2 * | | 3/2008 | Wager, III | H01L 29/02 257/43 |
| 7,718,526 B2 * | | 5/2010 | Arai | H01L 21/0206 257/E21.239 |
| 7,767,472 B2 * | | 8/2010 | Shigeta | B24B 37/013 257/E21.304 |
| 7,780,867 B1 * | | 8/2010 | Mayer | H01L 21/6708 216/105 |
| 7,880,167 B2 * | | 2/2011 | Yamazaki | H01L 27/3211 257/59 |
| 7,888,207 B2 * | | 2/2011 | Wager, III | H01L 29/02 257/350 |
| 7,977,234 B2 * | | 7/2011 | Arai | H01L 21/0206 257/E21.239 |
| 7,977,704 B2 * | | 7/2011 | Koyama | H01L 29/0696 257/139 |
| 8,053,253 B2 * | | 11/2011 | Goto | H01L 21/561 438/25 |
| 8,097,901 B2 * | | 1/2012 | Koyama | H01L 29/0696 257/139 |
| 8,420,409 B2 * | | 4/2013 | Goto | H01L 21/561 438/25 |
| 8,643,146 B2 * | | 2/2014 | Uemura | H01L 29/0619 257/170 |
| 8,698,195 B2 * | | 4/2014 | Oya | H01L 29/0696 257/133 |
| 8,890,172 B2 * | | 11/2014 | Yamazaki | H01L 27/3211 257/79 |
| 9,000,495 B2 * | | 4/2015 | Yamashita | H01L 22/32 257/276 |
| 9,064,770 B2 * | | 6/2015 | Kuo | H01L 21/02087 |
| 9,230,908 B2 * | | 1/2016 | Dekker | B06B 1/0292 |
| 9,293,726 B2 * | | 3/2016 | Yamazaki | H01L 27/3211 |
| 9,607,905 B2 * | | 3/2017 | Sakai | H01L 22/14 |
| 9,640,619 B2 * | | 5/2017 | Sakai | H01L 29/1608 |
| 9,685,353 B2 * | | 6/2017 | Ganesan | H01L 21/02087 |
| 9,799,506 B2 * | | 10/2017 | Sakai | H01L 21/02057 |
| 9,847,409 B2 * | | 12/2017 | Shiga | H01L 29/7397 |
| 9,991,110 B2 * | | 6/2018 | Kozasa | B24B 37/02 |
| 2001/0051432 A1 * | | 12/2001 | Yano | H01L 21/02087 438/690 |
| 2002/0160610 A1 * | | 10/2002 | Arai | H01L 21/0206 438/692 |
| 2002/0164930 A1 * | | 11/2002 | Hakomori | B24B 9/065 451/44 |
| 2003/0092244 A1 * | | 5/2003 | Oi | H01L 21/681 438/455 |
| 2004/0132295 A1 * | | 7/2004 | Basol | B08B 3/04 438/689 |
| 2004/0251518 A1 * | | 12/2004 | Preusse | C23F 1/18 257/571 |
| 2005/0170641 A1 * | | 8/2005 | Kondo | H01L 21/7684 438/633 |
| 2005/0211379 A1 * | | 9/2005 | Su | C23F 1/08 156/345.23 |
| 2005/0250331 A1 * | | 11/2005 | Arai | H01L 21/0206 438/691 |
| 2006/0137994 A1 * | | 6/2006 | Basol | H01L 21/288 205/668 |
| 2007/0259522 A1 * | | 11/2007 | Arai | H01L 21/0206 438/672 |
| 2009/0189181 A1 * | | 7/2009 | Koyama | H01L 29/0696 257/139 |
| 2009/0289341 A1 * | | 11/2009 | Yamazaki | G06K 19/07735 257/679 |

(56) References Cited

U.S. PATENT DOCUMENTS

| | | | | |
|---|---|---|---|---|
| 2009/0305467 | A1* | 12/2009 | Goto | H01L 21/561 |
| | | | | 438/125 |
| 2010/0227474 | A1* | 9/2010 | Arai | H01L 21/0206 |
| | | | | 438/653 |
| 2011/0220962 | A1* | 9/2011 | Koyama | H01L 29/0696 |
| | | | | 257/139 |
| 2012/0068310 | A1* | 3/2012 | Uemura | H01L 29/0619 |
| | | | | 257/577 |
| 2012/0108014 | A1* | 5/2012 | Goto | H01L 21/561 |
| | | | | 438/125 |
| 2012/0187544 | A1* | 7/2012 | Yamashita | H01L 22/32 |
| | | | | 257/620 |
| 2013/0328105 | A1* | 12/2013 | Matsuura | H01L 29/0696 |
| | | | | 257/139 |
| 2014/0024170 | A1* | 1/2014 | Kuo | H01L 21/02087 |
| | | | | 438/98 |
| 2014/0070830 | A1* | 3/2014 | Sakai | G01R 1/06777 |
| | | | | 324/754.01 |
| 2014/0077259 | A1* | 3/2014 | Uemura | H01L 29/0619 |
| | | | | 257/139 |
| 2014/0293751 | A1* | 10/2014 | Dekker | B06B 1/0292 |
| | | | | 367/181 |
| 2015/0001087 | A1* | 1/2015 | Dinneen | H01L 21/67253 |
| | | | | 205/81 |
| 2016/0020310 | A1* | 1/2016 | Shiga | H01L 22/14 |
| | | | | 257/139 |
| 2016/0056085 | A1* | 2/2016 | Ohashi | G01R 31/2639 |
| | | | | 438/17 |
| 2017/0162458 | A1* | 6/2017 | Onozawa | H01L 22/20 |

FOREIGN PATENT DOCUMENTS

| | | | |
|---|---|---|---|
| JP | WO 2010021070 A1 * | 2/2010 | G01R 31/20 |
| JP | 2013-171851 | 9/2013 | |
| JP | 2013-183143 | 9/2013 | |
| JP | 201317185 A1 * | 9/2013 | |
| JP | 2013183143 A * | 9/2013 | |
| JP | 2013-251466 | 12/2013 | |
| JP | 2013-258190 | 12/2013 | |
| JP | 2014-53552 | 3/2014 | |

OTHER PUBLICATIONS

International Search Report dated Apr. 5, 2016 in corresponding International Application No. PCT/JP2016/000464.

Japanese Office Action dated Oct. 31, 2017 in corresponding Japanese Patent Application No. 2017-506043.

International Preliminary Report on Patentability dated Sep. 28, 2017 in corresponding International Patent Application No. PCT/JP2016/000464.

* cited by examiner

METHOD FOR MANUFACTURING SEMICONDUCTOR DEVICE

CROSS-REFERENCE TO RELATED APPLICATION

This application is a Continuation of PCT Application No. PCT/JP2016/000464, filed on Jan. 29, 2016, and claims the priority of Japanese Patent Application No. 2015-052594, filed on Mar. 16, 2015, the content of both of which is incorporated herein by reference.

BACKGROUND OF THE INVENTION

1. Field of the Invention

The present invention relates to methods for manufacturing semiconductor devices, and more particularly to a technology effectively applicable to a method for manufacturing a semiconductor device having a trench gate structure.

2. Description of the Related Art

As switching devices used in inverters or converters in power conversion devices, insulated-gate bipolar transistors (IGBT) having a trench gate structure are known. Such an IGBT having a trench gate structure, if a capacitance between a gate and a collector is large, requires a considerable amount of charge/discharge time and may cause an increase in generated loss when shifting from an ON state to an OFF state. The generated loss is a sum of steady-state loss determined depending on an ON-state voltage and switching loss upon the ON state and the OFF state. It is therefore essential to reduce the capacitance between the gate and the collector causing such switching loss.

JP 2007-074006A discloses a dummy trench structure for reducing a capacitance between a gate and a collector. In the dummy trench structure, an electrode provided in a predetermined trench (dummy trench) of a plurality of trenches is electrically connected to an emitter electrode. The structure disclosed in JP 2007-074006A can decrease an absolute value of a gate capacitance, and also decrease a capacitance between the gate and the collector in the IGBT particularly including a floating layer.

However, the dummy trench structure disclosed in JP 2007-074006A, in which the electrode provided in the dummy trench is electrically connected to the emitter electrode, cannot easily screen out defective portions such as abnormal shape of the dummy trench or quality-degradation of an insulating film inserted between the dummy trench and the electrode by applying voltages.

SUMMARY OF THE INVENTION

An object of the present invention is to provide a method for manufacturing a semiconductor device having a trench gate structure, capable of performing appropriate screening of defective chips in a process of manufacturing the semiconductor device.

In order to achieve the object described above, an aspect of the present invention inheres in a method for manufacturing a semiconductor device encompassing: digging first and second trenches at a top surface of a plate-like base-body portion; forming an insulating film in an inside of each of the first and second trenches; laminating a conductive film on the top surface of the base-body portion so as to bury the first and second trenches with the conductive film via the insulating film; testing insulation-characteristics of the insulating film by applying a voltage between the conductive film and a bottom surface of the base-body portion; and after testing the insulation-characteristics, selectively removing the conductive film from the top surface of the base-body portion, so as to define a gate electrode in the first trench and bury an separated-electrode in the second trench, the separated-electrode being separated from the gate electrode.

DESCRIPTION OF EMBODIMENTS

Figure 1:
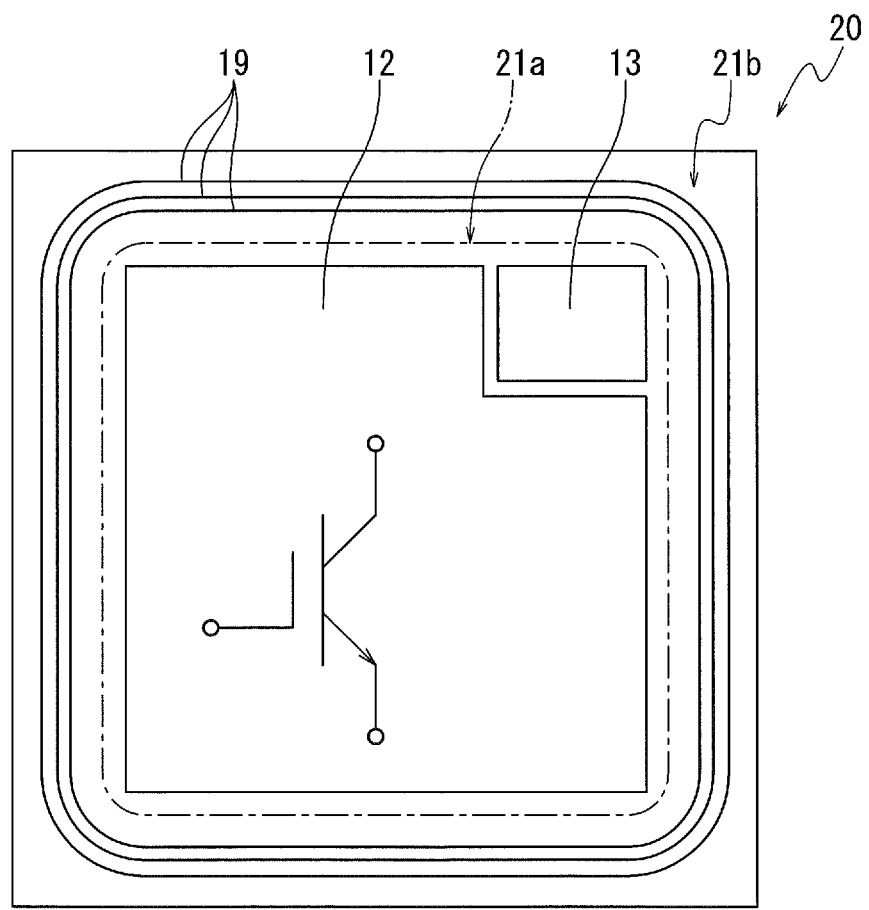
FIG. 1 is a chip layout of a semiconductor device according to a first embodiment of the present invention.

Hereinafter, with reference to the Drawings, methods for semiconductor devices according to first to third embodiments of the present invention will be described in detail.

As used herein, a "first main electrode region" represents one of an emitter region and a collector region in an insulated-gate bipolar transistor (IGBT). The first main electrode region represents one of a source region and a drain region in a field effect transistor (FET) or a static induction transistor (SIT). The first main electrode region represents one of an anode region and a cathode region in a static induction thyristor (SI Thy) or a gate turn-off thyristor (GTO).

A "second main electrode region" represents the other one of the emitter region and the collector region, not serving as the first main electrode region, in the IGBT. The second main electrode region represents the other one of the source region and the drain region, not serving as the first main electrode region, in the FET or the SIT. The second main electrode region represents the other one of the anode region and the cathode region, not serving as the first main electrode region, in the SI Thy or the GTO.

Namely, when the first main electrode region is the emitter region, the second main electrode region is the collector region. When the first main electrode region is the source region, the second main electrode region is the drain region. When the first main electrode region is the anode region, the second main electrode region is the cathode region. The following first to third embodiments illustrate an IGBT having a trench gate structure, wherein the emitter region is referred to as the "first main electrode region", and the collector region is referred to as the "second main electrode region".

While the following first to third embodiments exemplify a case in which a first conductivity-type is n-type, and a second conductivity-type is p-type, the present invention may also be applicable to the inverse case in which the first conductivity-type is p-type, and the second conductivity-type is n-type. In the Specification and the appended Drawings, the majority carriers are electrons in a layer or a region labelled by the mark "n", and the majority carriers are holes in a layer or a region labelled by the mark "p". The sign "+" or "−" labelled to the mark "n" or "p" denotes that a semiconductor region has a higher or lower impurity concentration than a region without the sign "+" or "−" labelled.

In the following description, the terms "top" and "lower" in, for example, "top surface" and "bottom surface" are defined depending on cross-sectional views. For example, when the direction of a semiconductor device is changed by 90 degrees and is then observed, the terms "top" and "bottom" change to "left" and "right", respectively. When the observing direction of the semiconductor device is changed by 180 degrees, the terms "top" and "bottom" shall be reversed.

In the Specification and the appended Drawings, the same or similar elements in the following first to third embodiments are indicated by the same or similar reference numerals, and overlapping explanations are not repeated herein. It should be understood that the dimensions in the appended Drawings described in the following first to third embodiments are not drawn to scale for brevity or for clarity. The present invention is not limited to the explanations of the following first to third embodiments without departing from the scope of the present invention.

First Embodiment

Structure of Semiconductor Device Pertaining to First Embodiment

As illustrated in the plan view of FIG. 1, a semiconductor device according to a first embodiment of the present invention is an IGBT mainly made by a semiconductor chip 20 having a rectangular shape in the plane. The shape of the chip in the plane is indicated for illustration purposes only and is not limited to the rectangular shape.

The semiconductor chip 20 includes an active-element arrangement area 21a located in a central portion, and a breakdown-voltage improving-area 21b surrounding the periphery of the active-element arrangement area 21a. In the active-element arrangement area 21a, a first main electrode 12 serving as an emitter electrode electrically connected to separated-electrodes 6b illustrated in FIG. 2, and a control electrode 13 electrically connected to gate electrodes 6a are arranged as illustrated in FIG. 2.

The first main electrode 12 and the control electrode 13 are used as external terminals (bonding pads) to be connected with connecting mechanisms such as bonding wires, so that the first main electrode 12 and the control electrode 13 can be electrically connected to external elements. As illustrated in FIG. 2, the semiconductor chip 20 includes a first conductivity-type (n⁻-type) drift layer 2 implemented by a semiconductor substrate $2_{sub}$ made of single crystalline silicon, for example.

In the active-element arrangement area 21a, a switching device having a trench gate structure, which serves as the semiconductor device of the first embodiment, is disposed as indicated by the circuit symbol (symbol mark) in FIG. 1. Although not limited to the structure illustrated in FIG. 1, in the breakdown-voltage improving-area 21b, triple-level second conductivity-type (p-type) field limiting ring (FLR) regions 19 surround around the active-element arrangement area 21a in triple rings.

Figure 2:
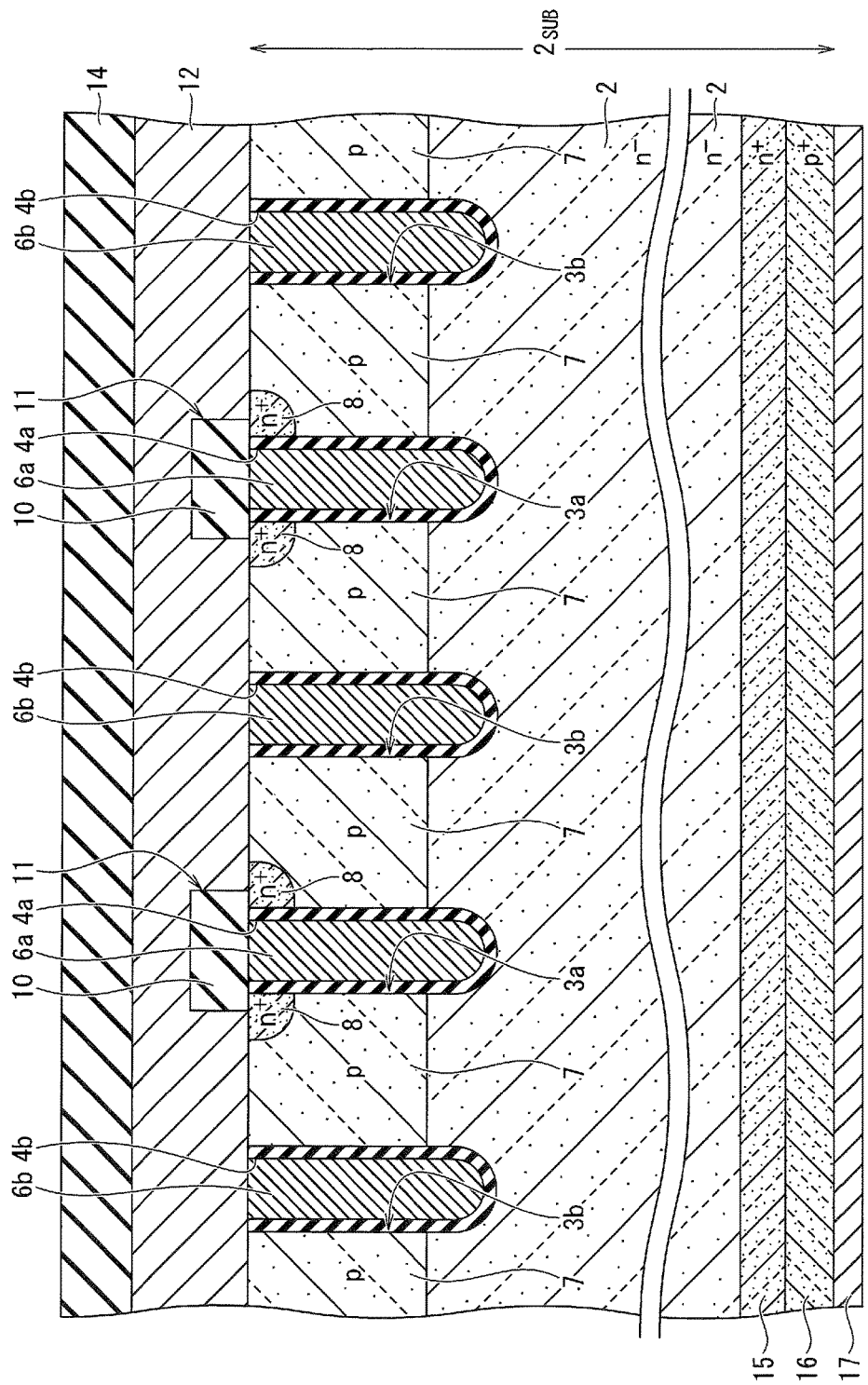
FIG. 2 is a cross-sectional view of a principal part of the semiconductor device according to the first embodiment of the present invention.

The semiconductor device of the first embodiment includes the n⁻-type drift layer 2 implemented by a part of the semiconductor substrate $2_{sub}$, as illustrated in FIG. 2. A second conductivity-type (p-type) base region 7 is deposited on the drift layer 2. A plurality of first trenches 3a and second trenches 3b are cut toward the bottom surface of the base region 7 so as to penetrate the base region 7 from the top surface of the base region 7 and reach the drift layer 2. Although not limited to the structure illustrated in FIG. 2, the first embodiment exemplifies, for illustration purposes, a topology in which the two first trenches 3a and the three second trenches 3b are alternately arranged as a structure of a part of the semiconductor device.

The semiconductor device according to the first embodiment further includes first insulating films 4a laminated along the inner walls of the plurality of first trenches 3a, and second insulating films 4b laminated along the inner walls of the plurality of second trenches 3b.

The semiconductor device according to the first embodiment further includes gate electrodes 6a provided inside of the plurality of first trenches 3a via the first insulating films 4a, and separated-electrodes 6b provided inside of the plurality of second trenches 3b via the second insulating films 4b. The separated-electrodes 6b are electrically and structurally insulated and separated from the gate electrodes 6a.

The semiconductor device according to the first embodiment further includes first conductivity-type (n⁺-type) first main electrode regions 8 serving as emitter regions buried at upper portions of the base region 7 and in contact with the first main electrode 12. The first main electrode regions 8 are arranged on both sides in the width direction of the first trenches 3a so as to be opposed to each other. The first main electrode regions 8 are provided not on both sides of the second trenches 3b but only on both sides of the first trenches 3a. A second conductivity-type (p⁺-type) second main electrode region 16 serving as a collector region is arranged below the drift layer 2.

The semiconductor device according to the first embodiment further includes a second main electrode 17 serving as a collector electrode laminated in contact with the second main electrode region 16, and a first conductivity-type (n⁺-type) buffer layer 15 arranged on the bottom side of the drift layer 2.

As illustrated in FIG. 2, an interlayer insulating film 10, the first main electrode 12, and a passivation film 14 are sequentially arranged above the gate electrodes 6a and the separated-electrodes 6b. Although not illustrated in FIG. 2, the control electrode 13 illustrated in FIG. 1 is arranged at the same level as the first main electrode 12, over the gate electrodes 6a, the separated-electrodes 6b, and the interlayer insulating film 10. Although not illustrated, a first main electrode-bonding opening is cut in the passivation film 14 to expose a part of the first main electrode 12, and a control electrode-bonding opening is further cut in the passivation film 14 to expose a part of the control electrode 13.

The first main electrode 12 is electrically and metallurgically connected to the base region 7, the first main electrode regions 8, and the separated-electrodes 6b via contact holes 11 penetrating the interlayer insulating film 10 so as to achieve a low ohmic-contact resistance with each of the base region 7, the first main electrode regions 8, and the separated-electrodes 6b. The second main electrode 17 is also electrically and metallurgically connected to the second main electrode region 16 so as to achieve a low ohmic-contact resistance with the second main electrode region 16.

Although not illustrated in detail in FIG. 2, the gate electrodes 6a are electrically connected to the control electrode 13 illustrated in FIG. 1. The gate electrodes 6a are covered with the interlayer insulating film 10, so as to be electrically insulated and separated from the first main electrode regions 8 by the interlayer insulating film 10.

The separated-electrodes 6b are electrically connected to the first main electrode regions 8 in order to reduce a capacitance between the gate and the collector, which may cause switching loss of the semiconductor device, and first reference potentials are applied to the separated-electrodes 6b and the first main electrode regions 8 from the first main electrode 12. The separated-electrodes 6b are electrically insulated and separated from the gate electrodes 6a and the control electrode 13 illustrated in FIG. 1. The separated-electrodes 6b are applied with the same level of potentials as the first main electrode regions 8 through the first main electrode 12. The separated-electrodes 6b will not contribute to the formation of channels, serving as dummy electrodes, which differ from the gate electrodes 6a. The second trenches 3b are dummy trenches filled with the separated-electrodes 6b.

The first insulating films 4a and the second insulating films 4b are made of silicon dioxide ($SiO_2$) film by thermal oxidation, for example. The first insulating films 4a and the second insulating films 4b may be a silicon oxide film or a silicon nitride ($Si_3N_4$) film deposited by chemical vapor deposition (CVD) method, instead of the thermal oxidation, or a stacked composite film of the $SiO_2$ film and the $Si_3N_4$ film. The $SiO_2$ films grown by the thermal oxidation having high densified quality is preferable as the first insulating films 4a and the second insulating films 4b, for a power device (a power semiconductor device) in which higher breakdown-voltage is required.

A polycrystalline silicon film to which impurity atoms are doped, or the doped-polysilicon (DOPOS) film may be used as a conductive film having low specific resistivity for the gate electrodes 6a and the separated-electrodes 6b. However, the gate electrodes 6a and the separated-electrodes 6b are not limited to the DOPOS film. Instead of the DOPOS film, refractory metal such as tungsten (W), molybdenum (Mo), titanium (Ti), and cobalt (Co), or a silicide of these metals such as $WSi_2$, $MoSi_2$, $TiSi_2$, and $CoSi_2$ may be used for the gate electrodes 6a and the separated-electrodes 6b. Another example used for the gate electrodes 6a and the separated-electrodes 6b may be "a polycide film" which is a composite film of a DOPOS film and a silicide film.

The interlayer insulating film 10 may be made of $SiO_2$ film deposited by CVD method. The interlayer insulating film 10 may be a $Si_3N_4$ film, a borosilicate glass (BSG) film, a phosphosilicate glass (PSG) film, or a borophosphosilicate glass (BPSG) film. The first main electrode 12 and the control electrode 13 may be an aluminum (Al) film, or a film of an aluminum alloy such as aluminum-silicon (Al—Si), aluminum-copper (Al—Cu), or aluminum-copper-silicon (Al—Cu—Si). The second main electrode 17 is a gold (Au) film, for example. The passivation film 14 may be made of polyimide-based insulating resin, or may be a BSG film, a PSG film, or a BPSG film.

In the base region 7 immediately below the first main electrode regions 8 is controlled by a voltage applied to the gate electrodes 6a so as to form channels. The base region 7 is a region in which channels are scheduled to be formed in the IGBT. In a switching device other than the IGBT, the base region 7a may be assigned by another channel-forming region, in which channels are scheduled to be formed on a surface equivalent to the base region in the IGBT.

The first insulating films 4a laminated inside of the first trenches 3a serve as gate insulating films which statically control the surface potentials of the channels formed in the base region 7 immediately below the first main electrode regions 8. On the other hand, the second insulating films 4b laminated inside of the second trenches 3b do not serve as the gate insulating films. However, the second insulating films 4b are also required to ensure reliability, similar to the first insulating films 4a, with respect to time-dependent dielectric breakdown (TDDB) behavior in which dielectric breakdown is caused with time, since electric fields also crowd at bottoms of the second trenches 3b. The reliability for the TDDB can be enhanced by screening of defective portions such as abnormal shape of the trenches and quality-degradation of the insulating films inserted between the trenches and the electrodes.

Operation of Semiconductor Device Pertaining to First Embodiment

Next, with reference to FIG. 2, the operation of the semiconductor device according to the first embodiment will be described below. The semiconductor device is in the OFF state when a voltage applied to the gate electrodes 6a is a threshold or below, under a condition such that a first reference potential (for example, 0 V) is applied to the first main electrode 12, and a second reference potential (for example, 600 V) higher than the first reference potential is applied to the second main electrode 17.

In the OFF state, when a voltage greater than a threshold is applied to the gate electrodes 6a via a gate resistor through a gate drive circuit (not illustrated), because the portions facing the gate electrodes 6a via the first insulating films 4a in the p-type base region 7 are inverted, n-type channels are formed. Accordingly, electrons flow from the first main electrode 12, pass through the $n^+$-type first main electrode regions (emitter regions) 8 and the channels in the p-type base region 7, and are injected into the $n^-$-type drift layer 2, so that the semiconductor device turns on. In the ON state, voltage drop between the first main electrode 12 and the second main electrode 17 corresponds to an on-state voltage.

When the semiconductor device is turned from the ON state to the OFF state, the voltage between the first main electrode 12 and the gate electrodes 6a is reduced to a threshold or below, so that electric charges accumulated in the gate electrodes 6a are exhausted to the gate drive circuit via the gate resistor. The inverted n-type channels then return to p-type and the n-type channels disappear, so that the supply of the electrons is stopped, and the semiconductor device thus turns off.

Method for Manufacturing Semiconductor Device Pertaining to First Embodiment

Next, with reference to FIGS. 3A to 20, a method for manufacturing an IGBT as the semiconductor device according to the first embodiment will be described below. Although the first embodiment is not limited to the following procedure, the first embodiment may include a step of digging the first trenches 3a and the second trenches 3b first, and a subsequent step of forming the p-type base region 7 and the $n^+$-type first main electrode regions 8, for example.

Note that FIGS. 3A, 3B, 8A, 8B, 9A and 9B illustrate the entire semiconductor substrate in a wafer state, before the wafer is diced into a plurality of chips. FIGS. 6, 7, 10, and 13 to 20 are cross-sectional views of a principal part of a chip-forming area defined in the semiconductor substrate in the wafer state. FIG. 11 is a cross-sectional view illustrating a state in which the semiconductor substrate is arranged on a conductive test-stage.

Figure 3A:
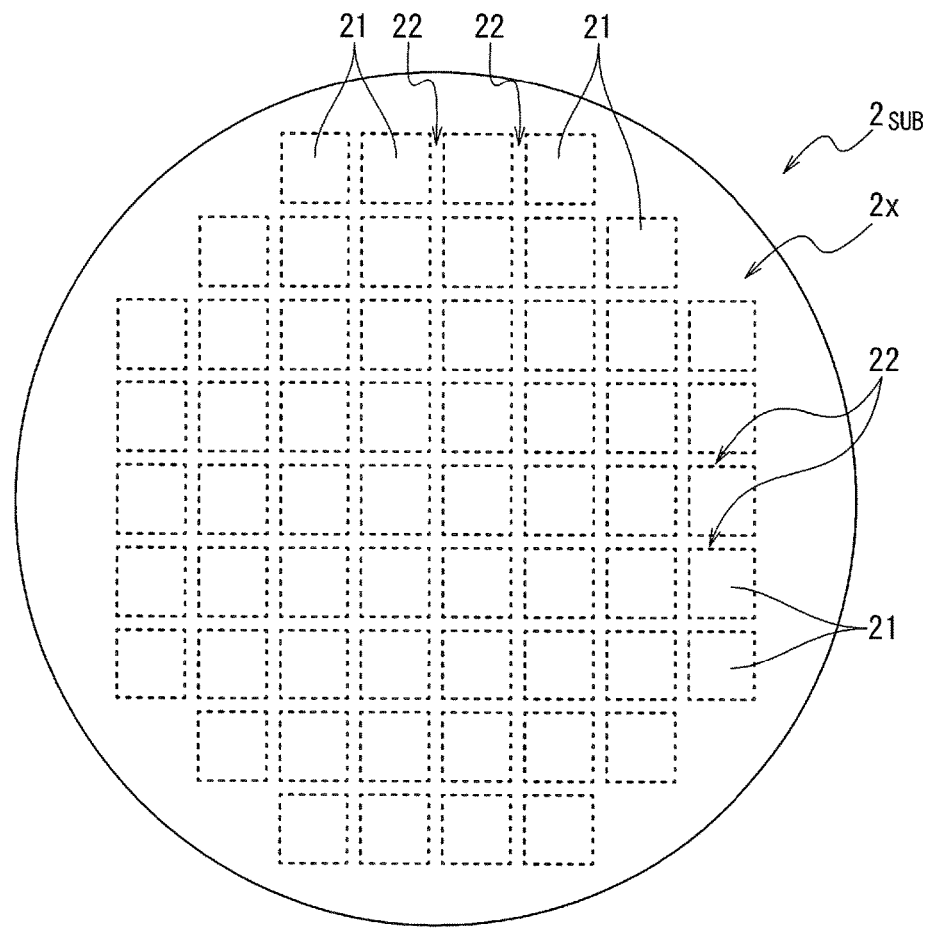
FIG. 3A is a plan view illustrating a schematic structure of a semiconductor substrate to which a method for manufacturing the semiconductor device according to the first embodiment of the present invention is applied.
Figure 3B:
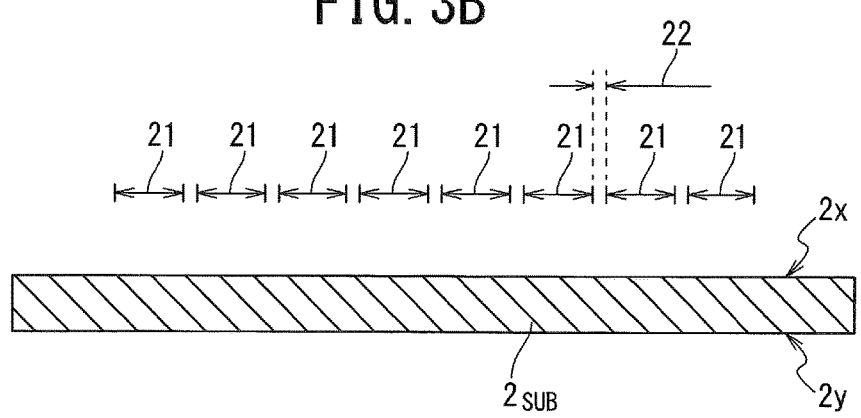
FIG. 3B is a cross-sectional view illustrating a schematic structure of a semiconductor substrate to which a method for manufacturing the semiconductor device according to the first embodiment of the present invention is applied.

(a) First, as illustrated in FIGS. 3A and 3B, an $n^-$-type semiconductor substrate $2_{sub}$ made of single crystalline silicon, for example, is prepared as a base-body portion. The semiconductor substrate $2_{sub}$ has a top surface $2x$ and a bottom surface $2y$ located on opposite sides, and has a circular shape in the plane.

FIGS. 3A to 20 illustrate the first conductivity-type ($n^-$-type) semiconductor substrate $2_{sub}$ used as "a base-body portion". Instead of the semiconductor substrate $2_{sub}$, an epitaxially grown layer having a triple-layered structure may be used as the base-body portion obtained by a buried-epitaxial growth process such that an n-type epitaxially grown layer serving as a buffer layer is grown on a second conductivity-type ($p^+$-type) semiconductor substrate, and thereafter, a first conductivity-type epitaxially grown layer having a lower concentration than the buffer layer is deposited on the buffer layer.

Figure 4:
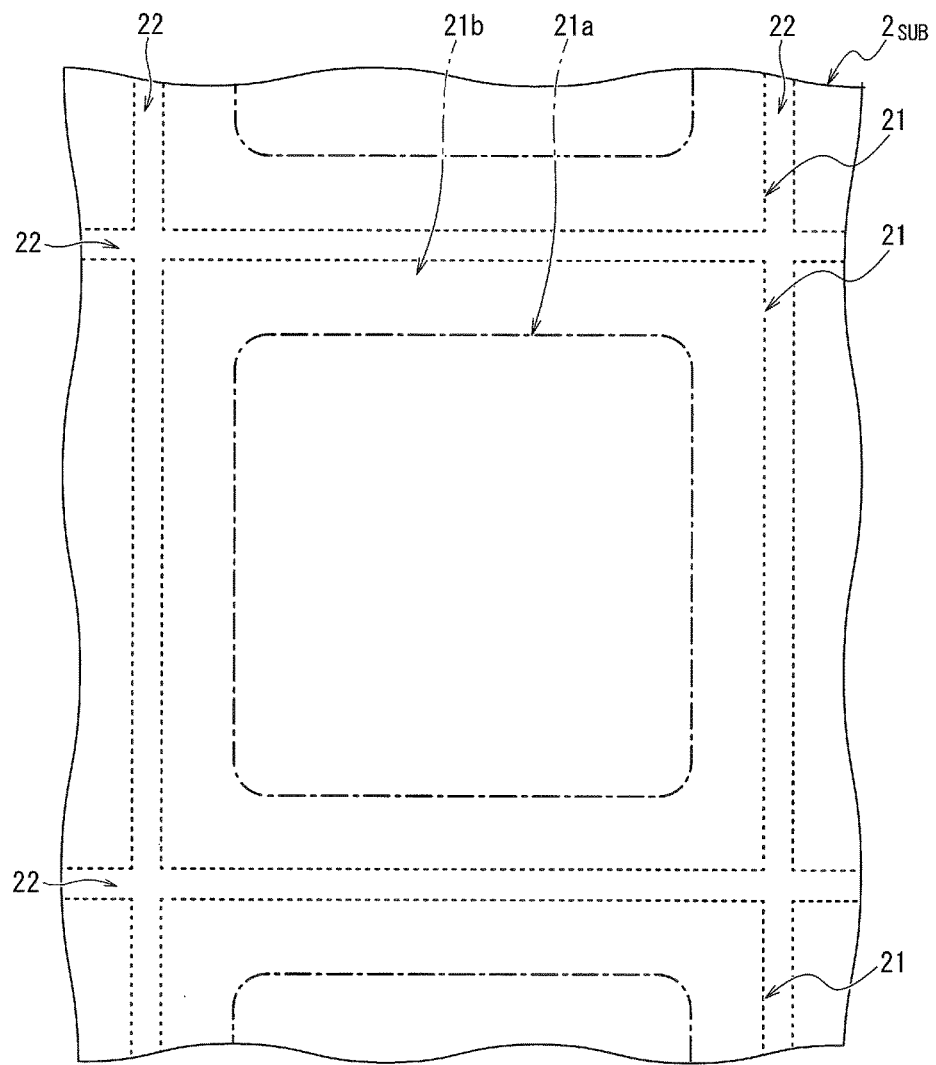
FIG. 4 is a plan view of an enlarged principal part in FIG. 3A.

The semiconductor substrate $2_{sub}$ is diced into a plurality of semiconductor chips, after finishing the process of manufacturing the semiconductor device according to the first embodiment. In the Specification and the appended Drawings, areas diced into semiconductor chips are defined as chip-forming areas 21, and cutting areas at which the semiconductor chips are diced are defined as scribing lanes (dicing lanes) 22. The semiconductor substrate $2_{sub}$ includes a plurality of chip-forming areas 21 defined into a matrix by the scribing lanes 22, although not defined physically as illustrated in FIGS. 3A and 3B. Similar to the semiconductor chip 20 illustrated in FIG. 1, each of the chip-forming areas 21 includes an active-element arrangement area 21a being scheduled for assigning the semiconductor device, and a breakdown-voltage improving-area 21b being scheduled for allocating FLR regions 19, although not defined physically as illustrated in FIG. 4.

Figure 5:
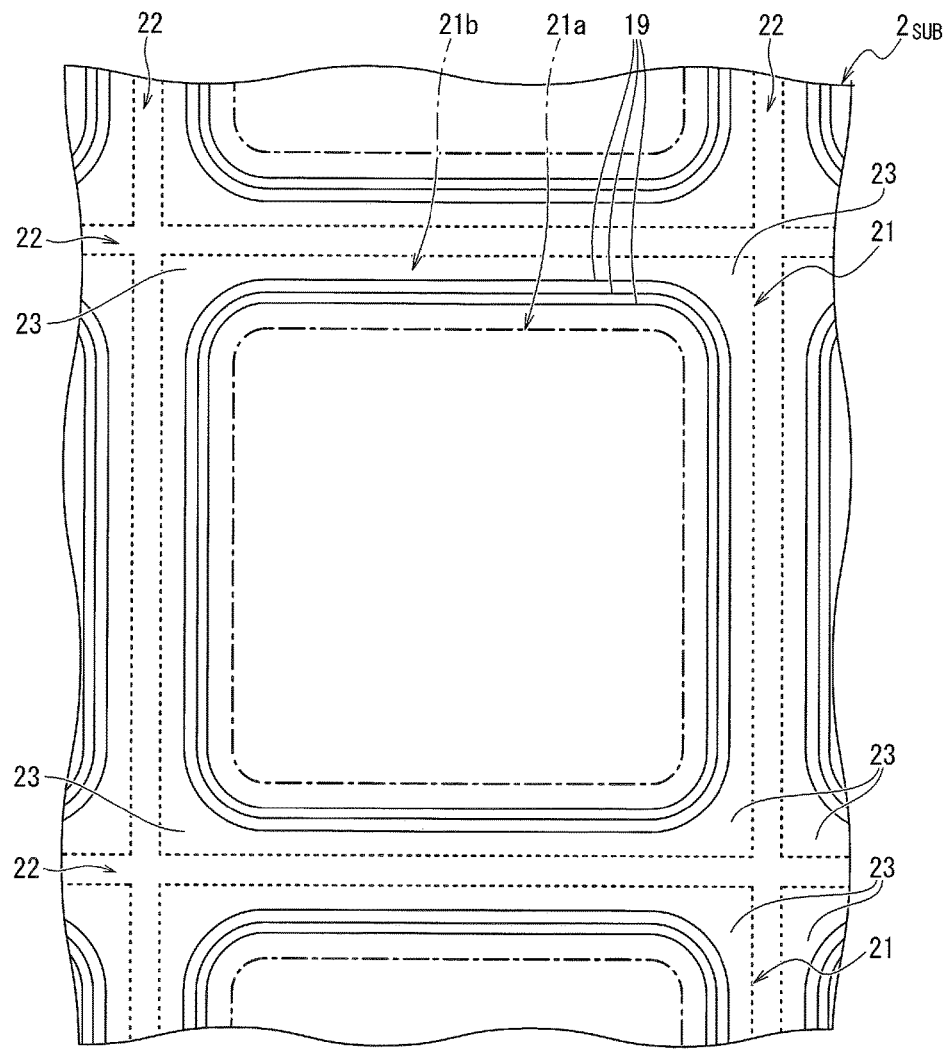
FIG. 5 is a plan view of a principal part for illustrating the method for manufacturing the semiconductor device according to the first embodiment of the present invention.

(b) Next, as illustrated in FIG. 5, the triple FLR regions 19 running in triple rings to surround the active-element arrangement area 21a are formed in the breakdown-voltage improving-area 21b of each chip-forming area 21 in the top surface 2x side portions of the semiconductor substrate $2^{sub}$. The triple FLR regions 19 are obtained by implanting p-type impurity ions such as boron ions ($^{11}B^+$) or boron difluoride ions ($^{49}BF_2^+$), followed by annealing so as to activate the implanted impurity ions. The triple FLR regions 19 are assigned in each of the chip-forming areas 21 illustrated in FIGS. 3A and 3B.

Figure 6:
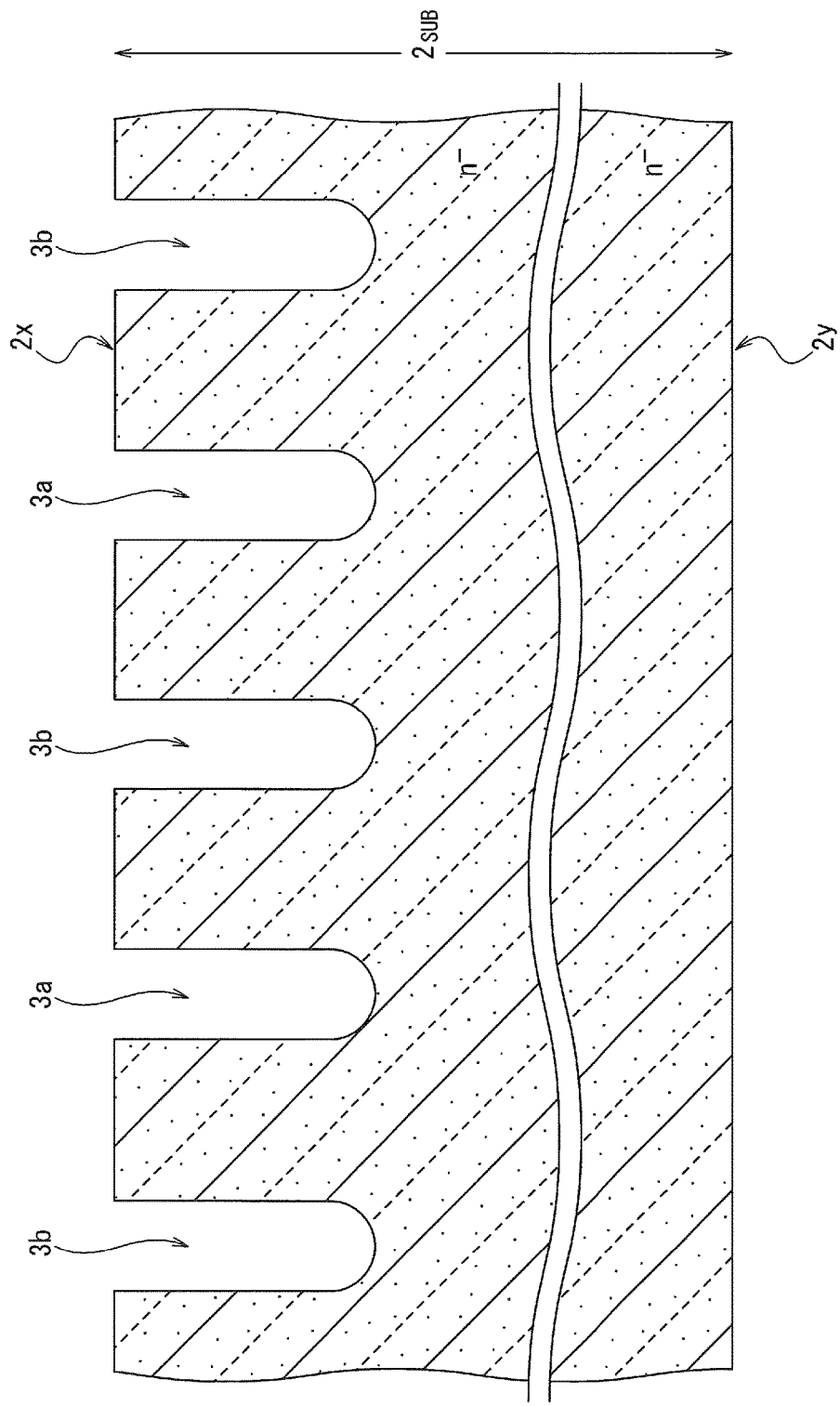
FIG. 6 is a cross-sectional view of the principal part for illustrating the method for manufacturing the semiconductor device according to the first embodiment of the present invention.

(c) Next, as illustrated in FIG. 6, a plurality of first trenches 3a and a plurality of second trenches 3b are dug in the upper layer of the top surface 2x of the semiconductor substrate $2_{sub}$. The first trenches 3a and the second trenches 3b are dug in stripe-like parallel pattern, each having a width of about one micrometer and a depth of about five to ten micrometers. The first trenches 3a and the second trenches 3b are dug such that the top surface 2x of the semiconductor substrate $2_{sub}$ is selectively removed by photolithography and dry etching such as reactive-ion etching (RIE). The first trenches 3a and the second trenches 3b are alternately arranged at predetermined intervals in one direction, but not limited to the arrangement illustrated in FIG. 6. The first trenches 3a and the second trenches 3b are dug in the active-element arrangement area 21a defined by the planar pattern illustrated in FIG. 4 in each of the chip-forming areas 21 illustrated in FIGS. 3A and 3B. The second trenches 3b serve as dummy trenches for the first trenches 3a.

(d) Next, an insulating film 4 made of $SiO_2$ film is laminated by processing such as thermal oxidation in the inside of each of the first trenches 3a and the second trenches 3b on the top surface 2x side of the semiconductor substrate $2_{sub}$. In this step, the insulating film 4 is also laminated on the top surface 2x of the semiconductor substrate $2_{sub}$ between the adjacent trenches, so as to continuously laminated along the top surface 2x of the semiconductor substrate $2_{sub}$ and the inside of each of the first trenches 3a and the second trenches 3b. The insulating film 4 is laminated in each of the chip-forming areas 21 illustrated in FIGS. 3A and 3B and also in each of the scribing lanes 22.

Figure 7:
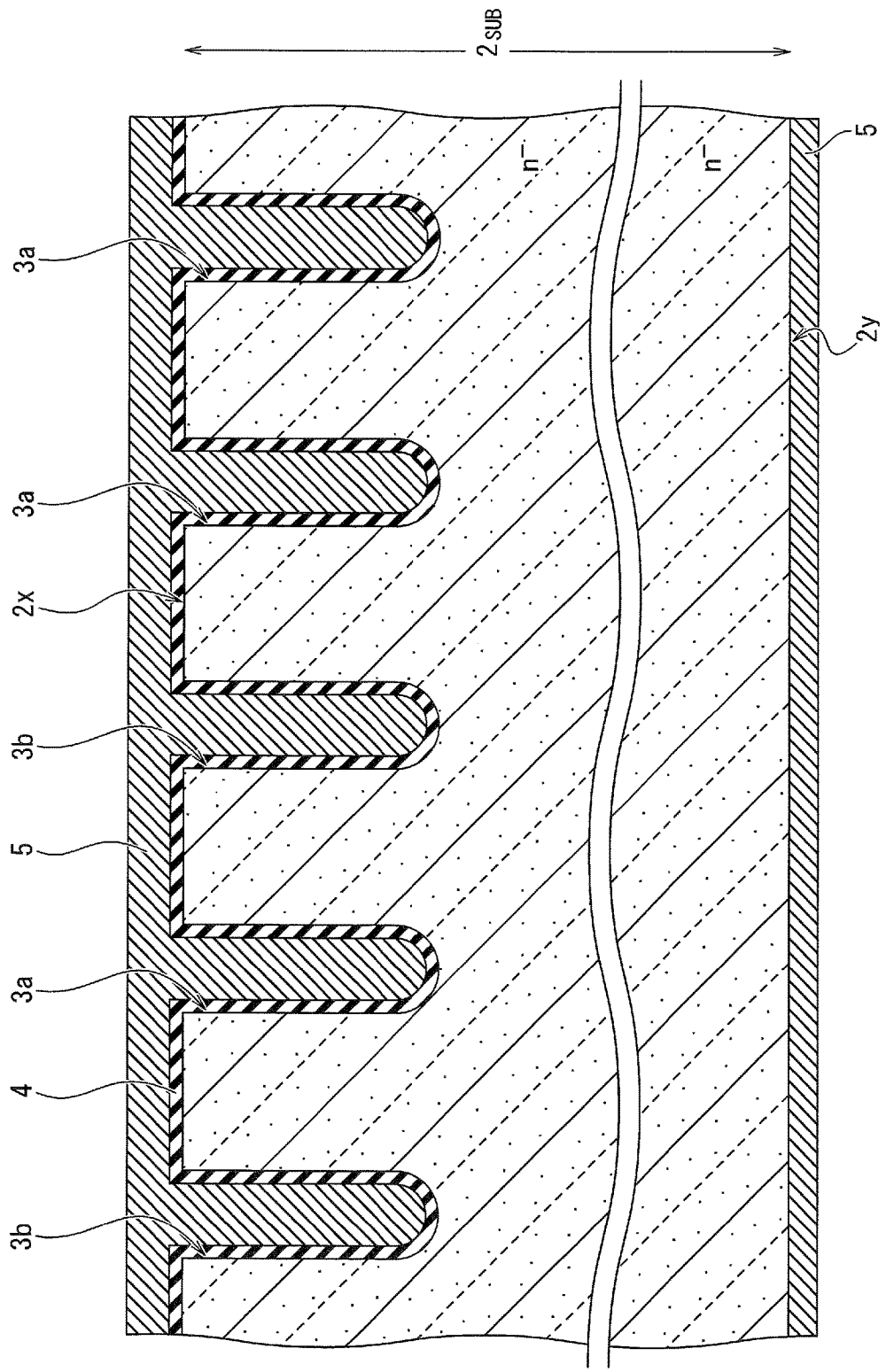
FIG. 7 is a cross-sectional view of the principal part for illustrating the method for manufacturing the semiconductor device according to the first embodiment of the present invention.
Figure 8A:
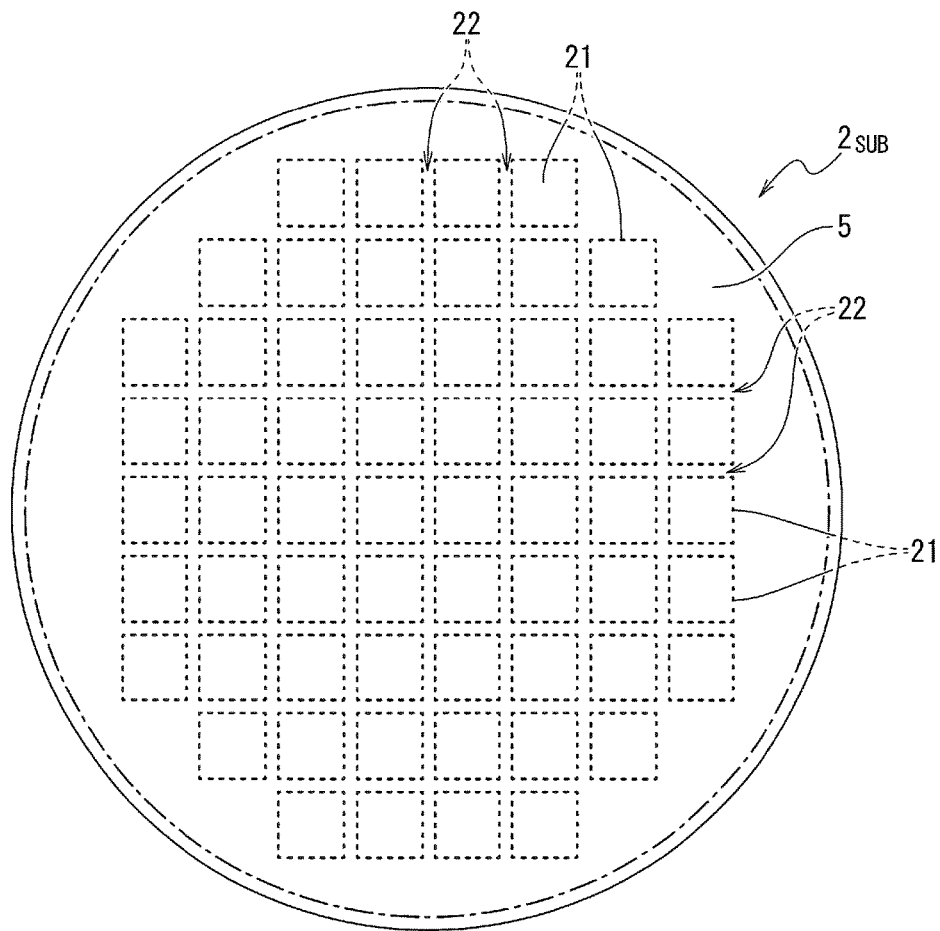
FIG. 8A is a plan view illustrating the method for manufacturing the semiconductor device according to the first embodiment of the present invention.
Figure 8B:
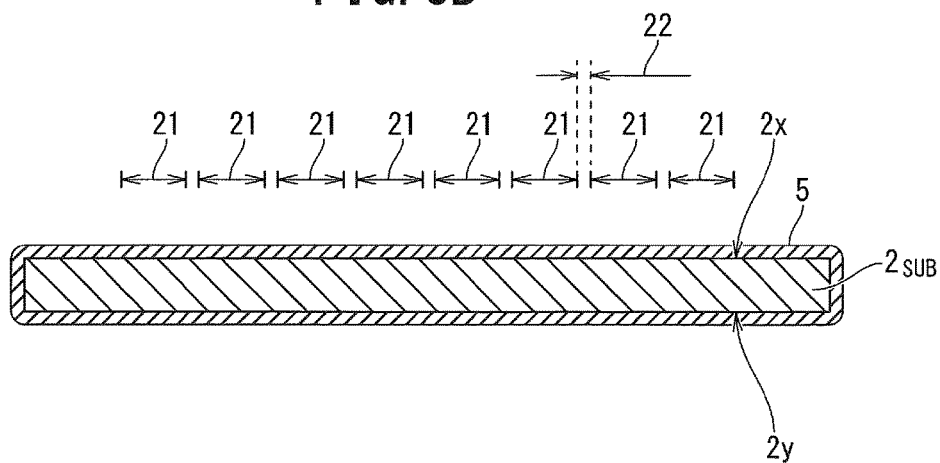
FIG. 8B is a cross-sectional view illustrating the method for manufacturing the semiconductor device according to the first embodiment of the present invention.

(e) Next, as illustrated in FIG. 7, a DOPOS film having low specific resistivity is deposited as a conductive film 5 on the top surface 2x of the semiconductor substrate $2_{sub}$ by CVD method so that the first trenches 3a and the second trenches 3b are filled with the conductive film 5. The conductive film 5 is deposited to a thickness of about one micrometer for a trench width of one micrometer, for example. In this step, as illustrated in FIGS. 8A and 8B, the conductive film 5 is deposited in a blanket mode on the chip-forming areas 21 and the scribing lanes 22. The conductive film 5 is further deposited on the bottom surface 2y and the side surface of the semiconductor substrate $2_{sub}$, so that the entire semiconductor substrate $2_{sub}$ is covered with the conductive film 5.

The insulating film 4 and the conductive film 5 buried in the respective first trenches 3a correspond to the later first insulating film 4a and the later gate electrode 6a, respectively, with reference to FIG. 13. The insulating film 4 and the conductive film 5 buried in the respective second trenches 3b correspond to the later second insulating film 4b and the later separated-electrode 6b, respectively, with reference to FIG. 13.

Figure 9A:
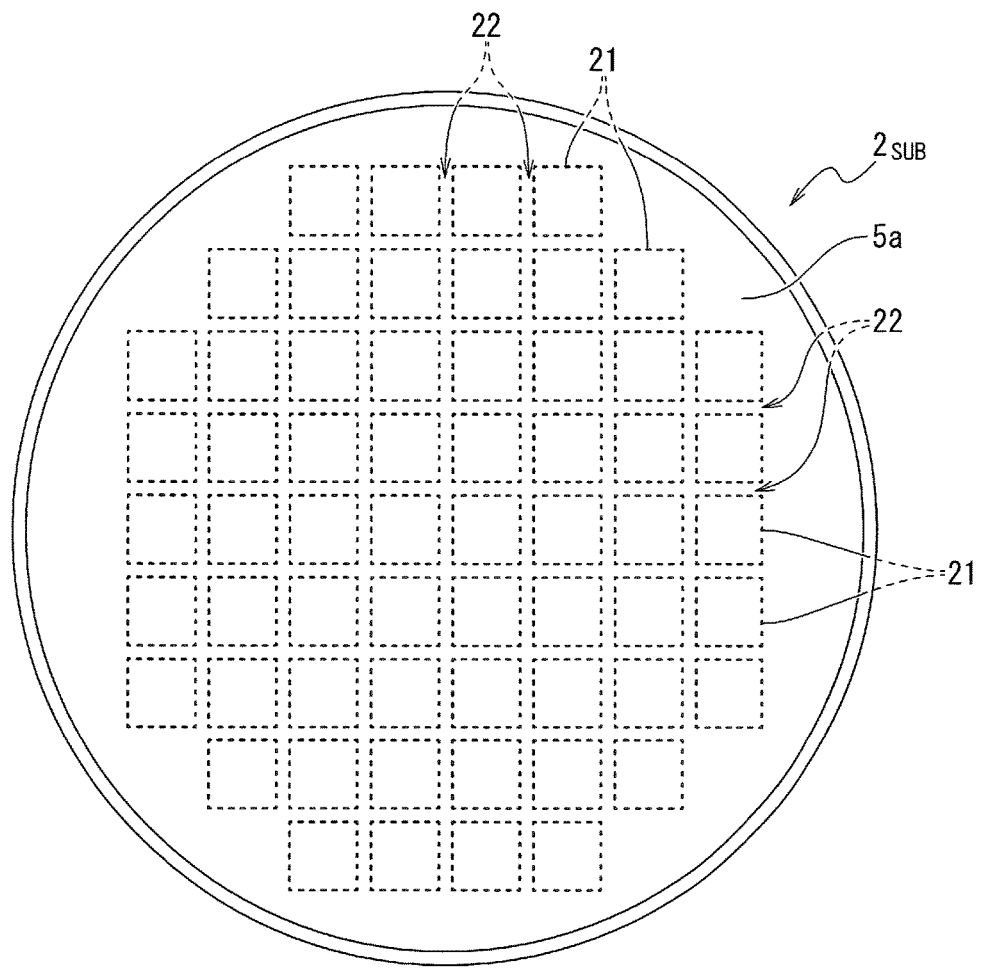
FIG. 9A is a plan view illustrating the method for manufacturing the semiconductor device according to the first embodiment of the present invention.
Figure 9B:
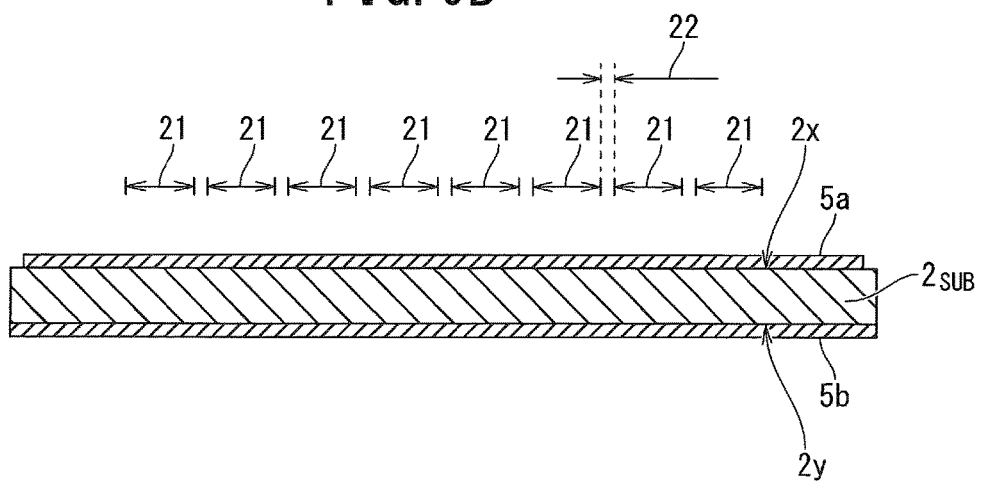
FIG. 9B is a cross-sectional view illustrating the method for manufacturing the semiconductor device according to the first embodiment of the present invention.

(f) Next, as illustrated in FIGS. 9A and 9B, the conductive film 5 covering the semiconductor substrate $2_{sub}$ to blanket from the edge of the top surface 2x to the side surface of the semiconductor substrate $2_{sub}$ is selectively removed by etching. The conductive film 5 covering the entire semiconductor substrate $2_{sub}$ is thus divided into a first conductive film 5a on the top surface 2x side of the semiconductor substrate $2_{sub}$ and a second conductive film 5b on the bottom surface 2y side of the semiconductor substrate $2_{sub}$.

Figure 10:
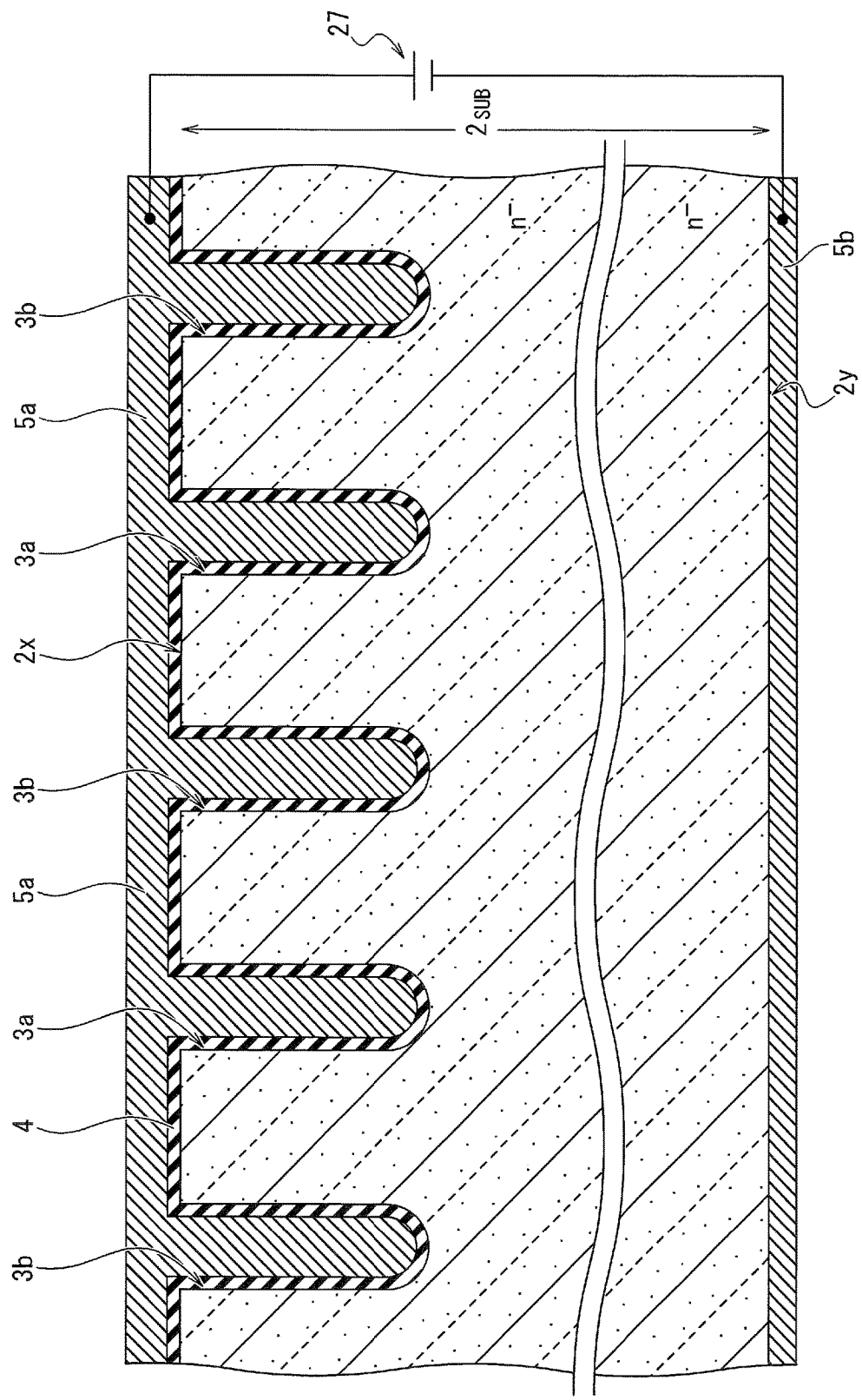
FIG. 10 is a cross-sectional view of the principal part for illustrating the method for manufacturing the semiconductor device according to the first embodiment of the present invention.
Figure 11:
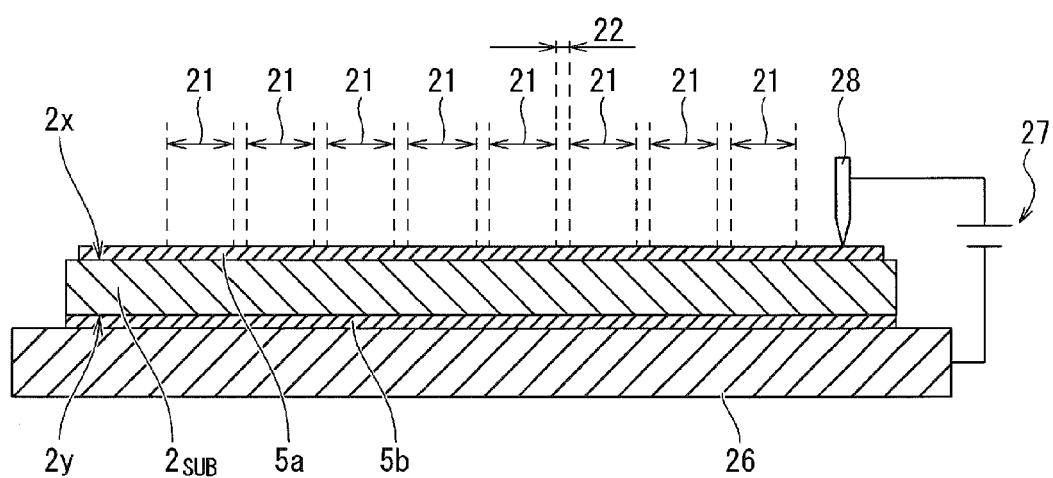
FIG. 11 is a cross-sectional view of the principal part for illustrating the method for manufacturing the semiconductor device according to the first embodiment of the present invention.

(g) Next, as illustrated in FIG. 10, the insulating characteristics of the insulating film 4 is tested by applying a voltage between the first conductive film 5a and the bottom surface 2y of the semiconductor substrate $2_{sub}$. In particular, as illustrated in FIG. 11, the semiconductor substrate $2_{sub}$ is arranged on a conductive test-stage 26 such that the second conductive film 5b on the bottom surface 2y of the semiconductor substrate $2_{sub}$ is brought into contact with the test-stage 26. The negative electrode side of a power supply 27 is electrically connected to the test-stage 26, and a tip of a probe needle 28 electrically connected to the positive electrode side of the power supply 27 is pressed against the first conductive film 5a. A higher voltage as compared with a case in normal operation is applied between the first conductive film 5a and the bottom surface 2y of the semiconductor substrate $2_{sub}$ from the power supply 27 so as to subject "a gate-voltage shock testing", and a current flowing between the first conductive film 5a and the bottom surface 2y of the semiconductor substrate $2_{sub}$ is then measured.

"The gate-voltage shock testing" is an acceleration test for evaluating the TDDB behavior in which dielectric breakdown is caused in the insulating film 4 with time. The gate-voltage shock testing is performed such that a voltage of about 5 MV/cm, which is higher than a voltage normally applied between a gate and a collector, such as 2 MV/cm, is applied between the first conductive film 5a and the bottom surface 2y of the semiconductor substrate $2_{sub}$.

In this step, as illustrated in FIG. 10, since the electric field is applied to the entire insulating film 4 located between the first conductive film 5a and the semiconductor substrate $2_{sub}$, including the inside of the first trenches 3a and the inside of the second trenches 3b, stress can be applied to the entire insulating film 4. When a leakage current between the first conductive film 5a and the semiconductor substrate $2_{sub}$ is a reference value or higher, the insulating film 4 is determined as being degraded, so as to test the insulating characteristics of the insulating film 4.

In the first embodiment, although the second trenches 3b are used as dummy trenches, and the first conductive film 5a (the later separated-electrodes 6b) inside the second trenches 3b are used as dummy electrodes, regardless of the assignment of the dummy trenches or the dummy electrodes, abnormal shape of each of the first trenches 3a and the second trenches 3b can be screened out by the voltage application. Furthermore, the degradation of the quality of the insulating film 4 (the later first insulating films 4a) between the first trenches 3a and the first conductive film 5a (the later gate electrodes 6a) and the quality of the insulating film 4 (the later second insulating films 4b) between the second trenches 3b and the first conductive film 5a (the later separated-electrodes 6b) can be screened out by the voltage application, regardless of the assignment of the dummy trenches or the dummy electrodes.

In the screening step, the second conductive film 5b serving as an electrode to which the voltage is applied from the negative electrode side of the power supply 27, is provided on the entire bottom surface 2y of the semiconductor substrate $2_{sub}$. As compared with a case in which the electrode to which the voltage is applied from the negative electrode side of the power supply 27 is provided on the top surface 2x of the semiconductor substrate $2_{sub}$, a crowding of electric field applied to the insulating film 4 between the first conductive film 5a and the semiconductor substrate $2_{sub}$, including the inside of the first trenches 3a and the inside of the second trenches 3b, can be suppressed. Accordingly, stress can be applied evenly to the entire insulating film 4.

When the semiconductor device according to the first embodiment is the IGBT, a voltage is applied across the first main electrode regions 8 with the base region 7, which are disposed on the top surface side of the semiconductor substrate $2_{sub}$ and the second main electrode region 16 on the bottom surface side of the semiconductor substrate $2_{sub}$, so that a current flows in the thickness direction of the semiconductor substrate $2_{sub}$. Thus, the stress corresponding to the actual operation can be applied to the insulating film 4.

When the tip of the probe needle 28 is pressed against the first conductive film 5a, a pressured-remain of concave is generated on the first conductive film 5a by pressing the tip of the probe needle 28. Further, extraneous particles may adhere on the surface of the first conductive film 5a. The pressured-remain by the probe needle 28 or the adhered extraneous particles may generate patterns of etching residues when the first conductive film 5a is etched afterward to bury the gate electrodes 6a and the separated-electrodes 6b in the first trenches 3a and the second trenches 3b, respectively. Thus, the gate-voltage shock testing is preferably performed such that the tip of the probe needle 28 is pressed against a specific location assigned at a portion of the first conductive film 5a, the specific location is scheduled to be removed afterward by etching.

Figure 12:
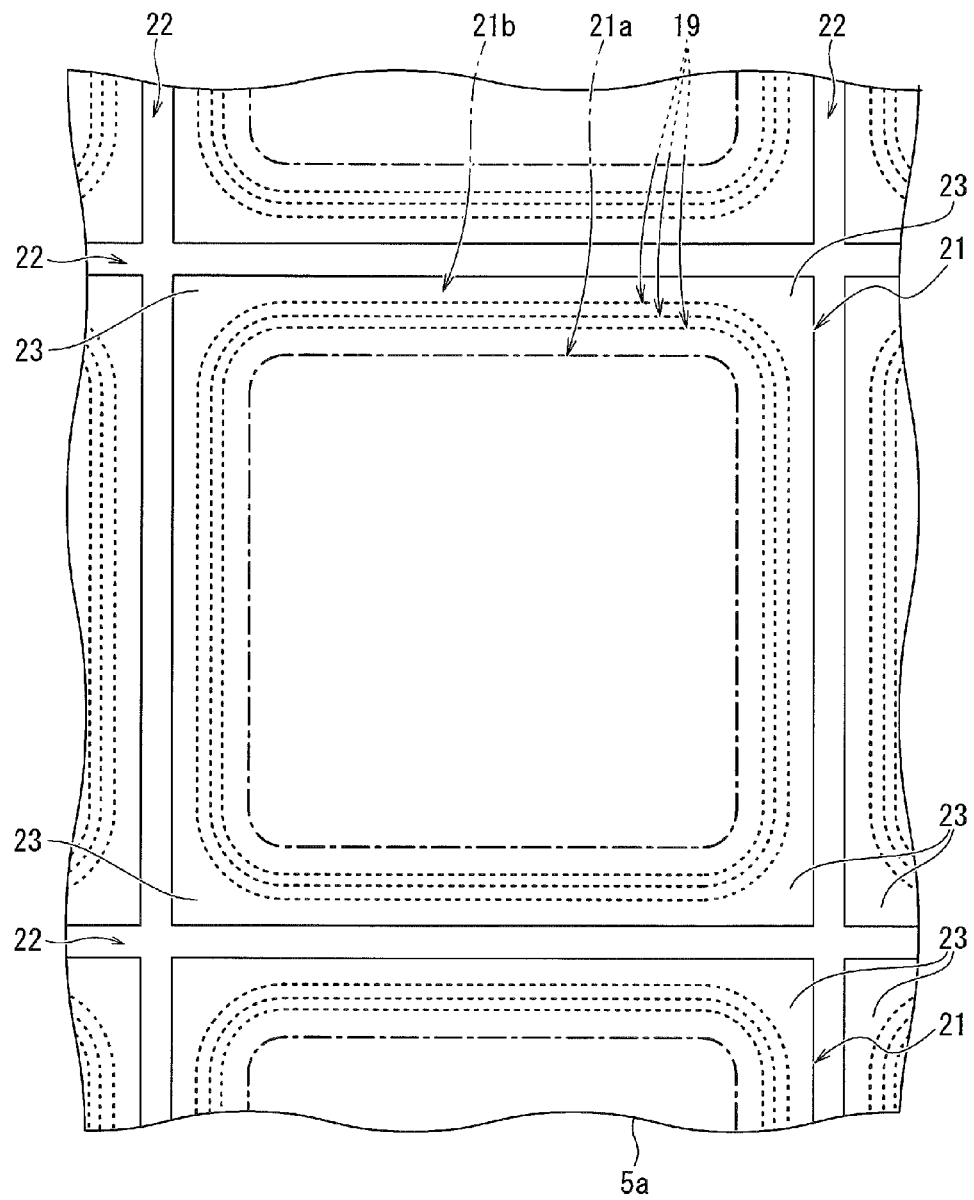
FIG. 12 is a plan view of an enlarged principal part in FIG. 9A.

More particularly, as illustrated in FIG. 12, the tip of the probe needle 28 is preferably pressed against the first conductive film 5a positioned at corners 23 of the chip-forming areas 21 or in the scribing lanes 22. In addition, since the FLR regions 19 have an arc-like planar pattern at each corner 23 of the chip-forming areas 21, and the area on the outside of the arc-like planar pattern is wider than the area on the outside of the strip-shaped planar pattern of the FLR regions 19, the tip of the probe needle 28 can easily be pressed against the first conductive film 5a at the corners 23 without damage to the FLR regions 19.

Figure 13:
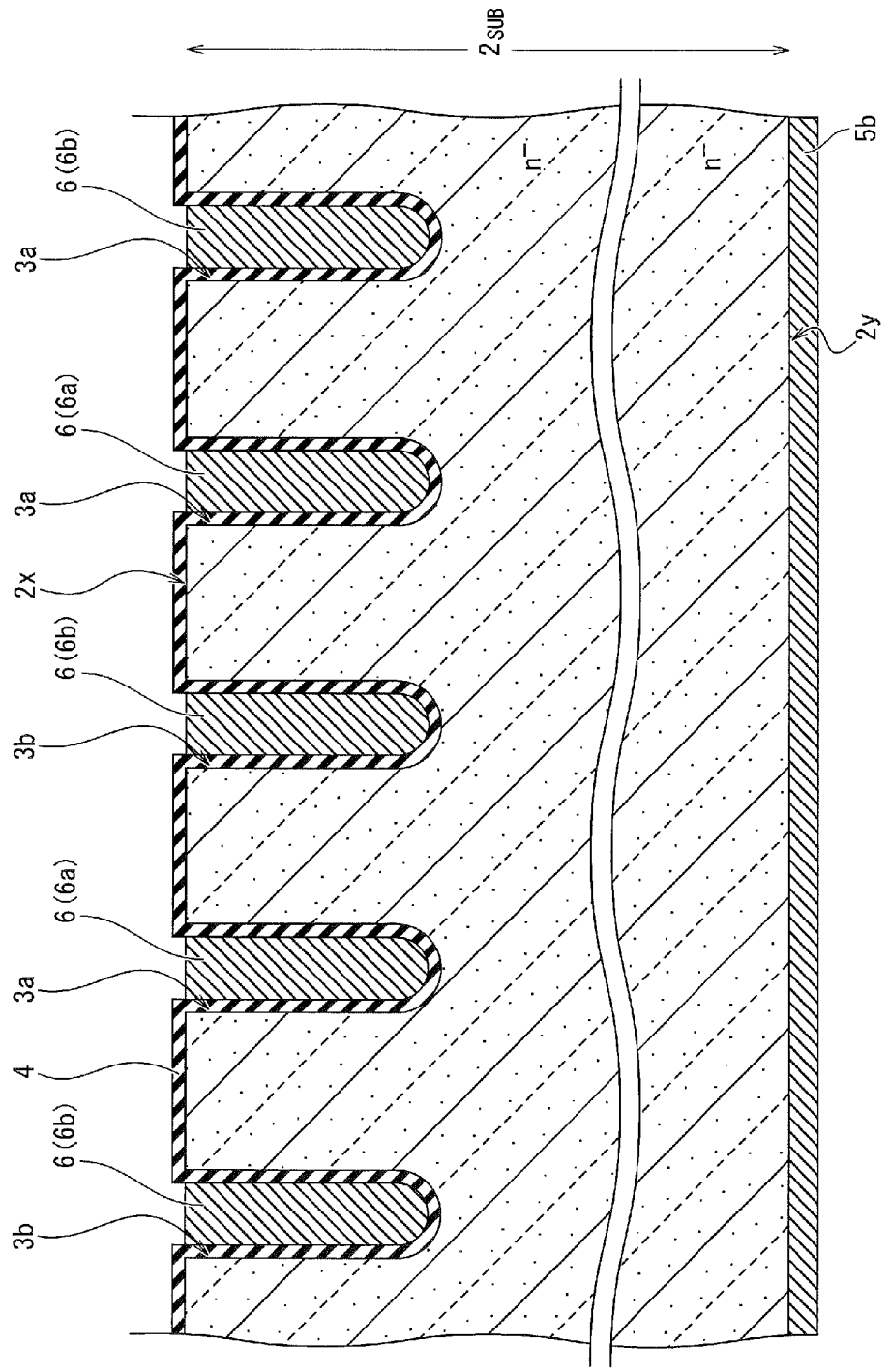
FIG. 13 is a cross-sectional view of the principal part for illustrating the method for manufacturing the semiconductor device according to the first embodiment of the present invention.

(h) Next, the first conductive film 5a is subjected to etch back by dry etching such as RIE, so as to selectively remove the first conductive film 5a from the top surface 2x of the semiconductor substrate $2_{sub}$, as illustrated in FIG. 13. As a result, the gate electrodes 6a each made of the first conductive film 5a are buried in the first trenches 3a, and the separated-electrodes 6b each made of the first conductive film 5a and electrically and structurally separated from the gate electrode 6a, are buried in the second trenches 3b. The selective removal of the first conductive film 5a is performed on each of the chip-forming areas 21 and the scribing lanes 22 illustrated in FIGS. 3A and 3B.

In the step of planarization, the first conductive film 5a is subjected to etch back under the selective etching conditions with respect to the insulating film 4, so that the insulating film 4 remaining at the top surface 2x of the semiconductor substrate $2_{sub}$ serves as an etching stopper, and prevents the top surface 2x of the semiconductor substrate $2_{sub}$ from being etched.

Figure 14:
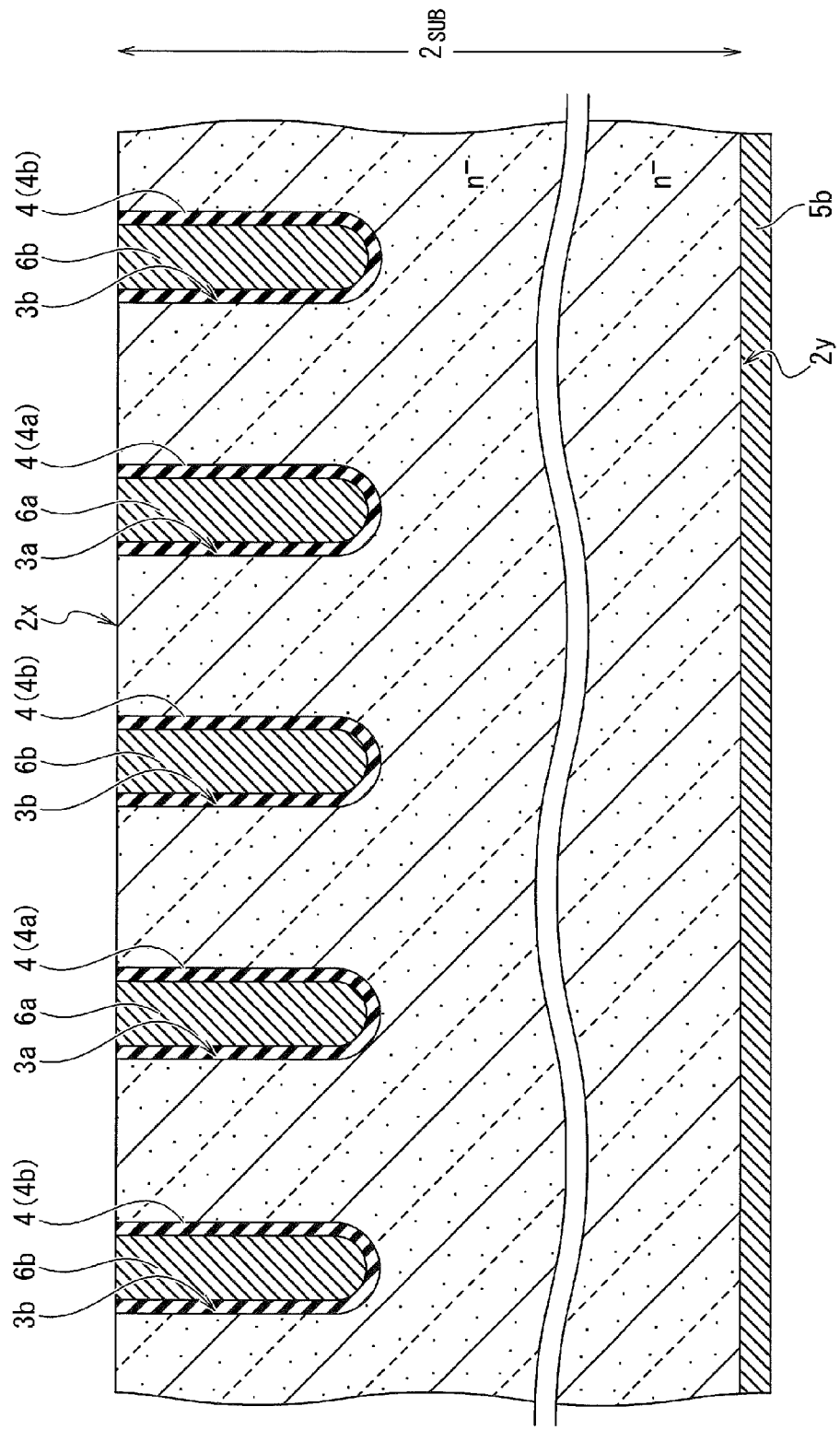
FIG. 14 is a cross-sectional view of the principal part for illustrating the method for manufacturing the semiconductor device according to the first embodiment of the present invention.

(i) Next, as illustrated in FIG. 14, the insulating film 4 located on the top surface 2x of the semiconductor substrate $2_{sub}$ is selectively removed by wet etching, for example, so as to expose the top surface 2x of the semiconductor substrate $2_{sub}$. The removal of the insulating film 4 is performed on each of the chip-forming areas 21 and the scribing lanes 22 illustrated in FIGS. 3A and 3B.

In this step, as illustrated in FIG. 14, the insulating film 4 is divided into the first insulating films 4a located inside of the first trenches 3a and the second insulating films 4b located inside of the second trenches 3b. The first insulating films 4a located inside of the first trenches 3a serve as gate insulating films. Although the second insulating films 4b located inside of the second trenches 3b serving as dummy trenches do not serve as the gate insulating films, the second insulating films 4b are subjected to the gate-voltage shock testing together with the first insulating films 4a, so as to ensure reliability for the TDDB behavior.

Figure 15:
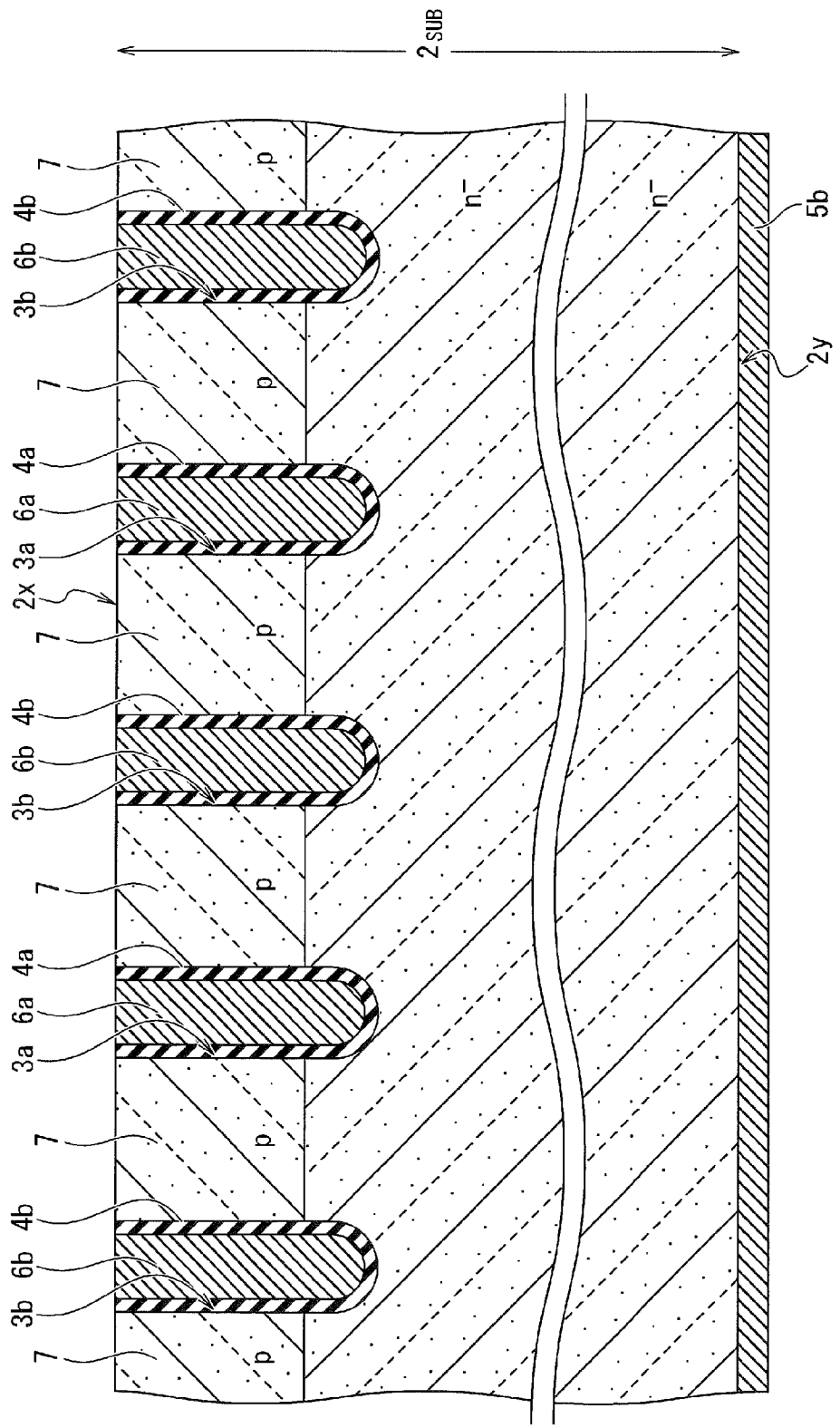
FIG. 15 is a cross-sectional view of the principal part for illustrating the method for manufacturing the semiconductor device according to the first embodiment of the present invention.

(j) Next, as illustrated in FIG. 15, the p-type base region 7 is formed in a surface layer of the top surface 2x of the semiconductor substrate $2_{sub}$. The base region 7 is obtained such that p-type impurity ions such as boron ions or boron difluoride ions are implanted, followed by annealing so as to activate the implanted impurity ions. The base region 7 is formed so as to have a shallower depth than the respective tips of the first trenches 3a and the second trenches 3b. For example, the base region 7 has a depth of about one micrometer to eight micrometers, while the first trenches 3a and the second trenches 3b each have a depth of about five to ten micrometers. The base region 7 is formed in each of the plurality of chip-forming areas 21 illustrated in FIGS. 3A and 3B.

According to the first embodiment, the base region 7 is formed after the gate electrodes 6a and the separated-electrodes 6b are buried inside of the first trenches 3a and the second trenches 3b, respectively. Alternatively, the base region 7 may be buried in the surface side portion at the top surface 2x of the semiconductor substrate $2_{sub}$ before the first trenches 3a and the second trenches 3b are dug in the surface side portion at the top surface 2x of the semiconductor substrate $2_{sub}$. In this case, the first trenches 3a and the second trenches 3b are dug in the surface side portion at the top surface 2x of the semiconductor substrate $2_{sub}$ so as to penetrate the base region 7.

Figure 16:
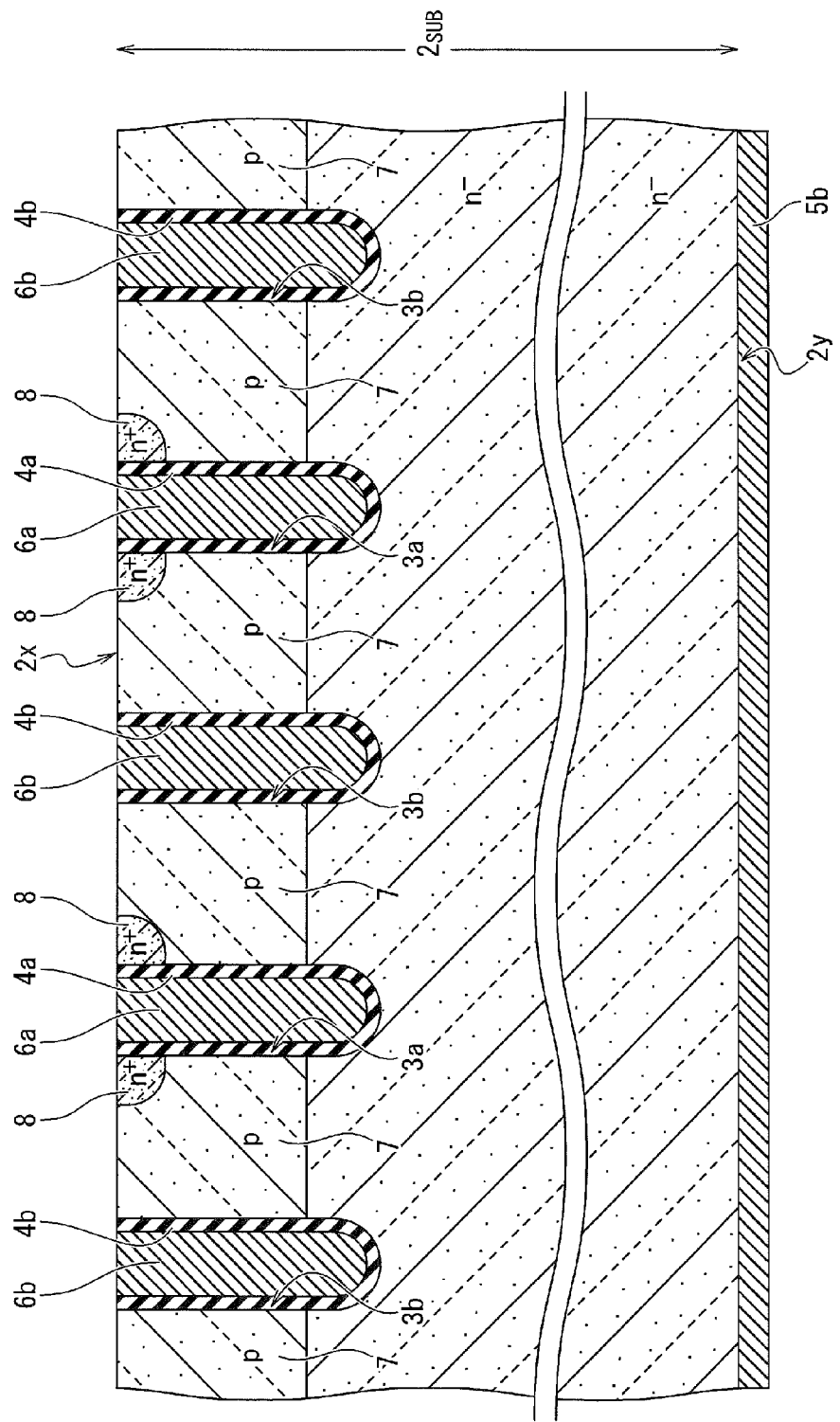
FIG. 16 is a cross-sectional view of the principal part for illustrating the method for manufacturing the semiconductor device according to the first embodiment of the present invention.

(k) Next, a mask for selective ion implantations is delineated by a photolithography step. N-type impurity ions such as arsenic ions ($^{75}$As$^+$) are implanted through window portions of the mask. Thereafter, annealing is performed so as to activate the implanted impurity ions. Accordingly, as illustrated in FIG. 16, the first main electrode regions 8 serving as emitter regions are selectively buried at the upper portions of the base region 7.

The first main electrode regions 8 are buried on both sides in the width direction of the first trenches 3a so as to be opposed to each other, whereas the first main electrode regions 8 are not buried on both sides of the second trenches 3b. The first main electrode regions 8 are buried so as to have a shallower depth than the base region 7. The first main electrode regions 8 are buried in each of the plurality of chip-forming areas 21 illustrated in FIGS. 3A and 3B.

Figure 17:
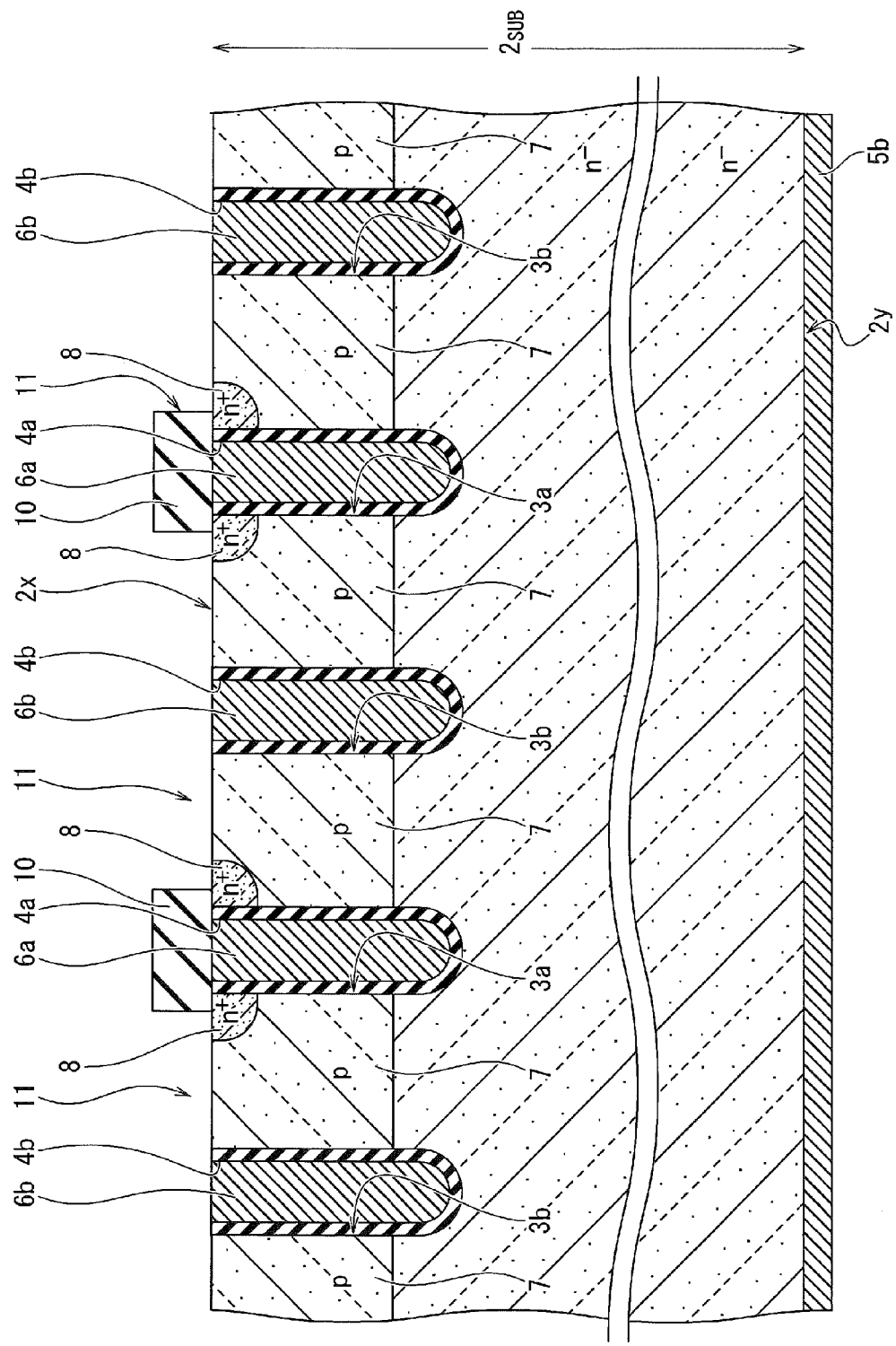
FIG. 17 is a cross-sectional view of the principal part for illustrating the method for manufacturing the semiconductor device according to the first embodiment of the present invention.

(l) Next, an interlayer insulating film 10 made of $SiO_2$ film is deposited by, for example, CVD method on the entire top surface of the semiconductor substrate $2_{sub}$, including the top surfaces of the gate electrodes 6a and the separated-electrodes 6b. As illustrated in FIG. 17, contact holes 11 penetrating the interlayer insulating film 10 are cut by photolithography and dry etching so as to reach from the upper surface of the interlayer insulating film 10 to the top surface 2x of the semiconductor substrate $2_{sub}$. The interlayer film 10 is divided into portions corresponding to the respective chip-forming areas 21 illustrated in FIGS. 3A and 3B, and the contact holes 11 are cut in each of the plurality of chip-forming areas 21 illustrated in FIGS. 3A and 3B.

(m) Next, a metallic film is deposited on the entire top surface 2x of the semiconductor substrate $2_{sub}$ by sputtering, for example, so as to bury the contact holes 11 and cover the interlayer insulating films 10. The metallic film is an Al film, or a film of an Al alloy such as Al—Si, Al—Cu, and Al—Cu—Si. Thereafter, a mask for etching is delineated by photolithography, so as to cut the metallic film by selective etching. Accordingly, as illustrated in FIG. 18, the first main electrode 12 serving as an emitter electrode is laminated on the top surface 2x of the semiconductor substrate $2_{sub}$, and the control electrode 13 illustrated in FIG. 1 is also laminated, although not illustrated in FIG. 18.

The first main electrode 12 is electrically and metallurgically connected to the base region 7, the first main electrode regions 8, and the separated-electrodes 6b so as to achieve low ohmic-contact resistance with each of the base region 7, the first main electrode regions 8, and the separated-electrodes 6b. The control electrode 13 is electrically connected to the respective gate electrodes 6a. The first main electrode 12 and the control electrode 13 are formed in each of the plurality of chip-forming areas 21 illustrated in FIGS. 3A and 3B.

Figure 18:
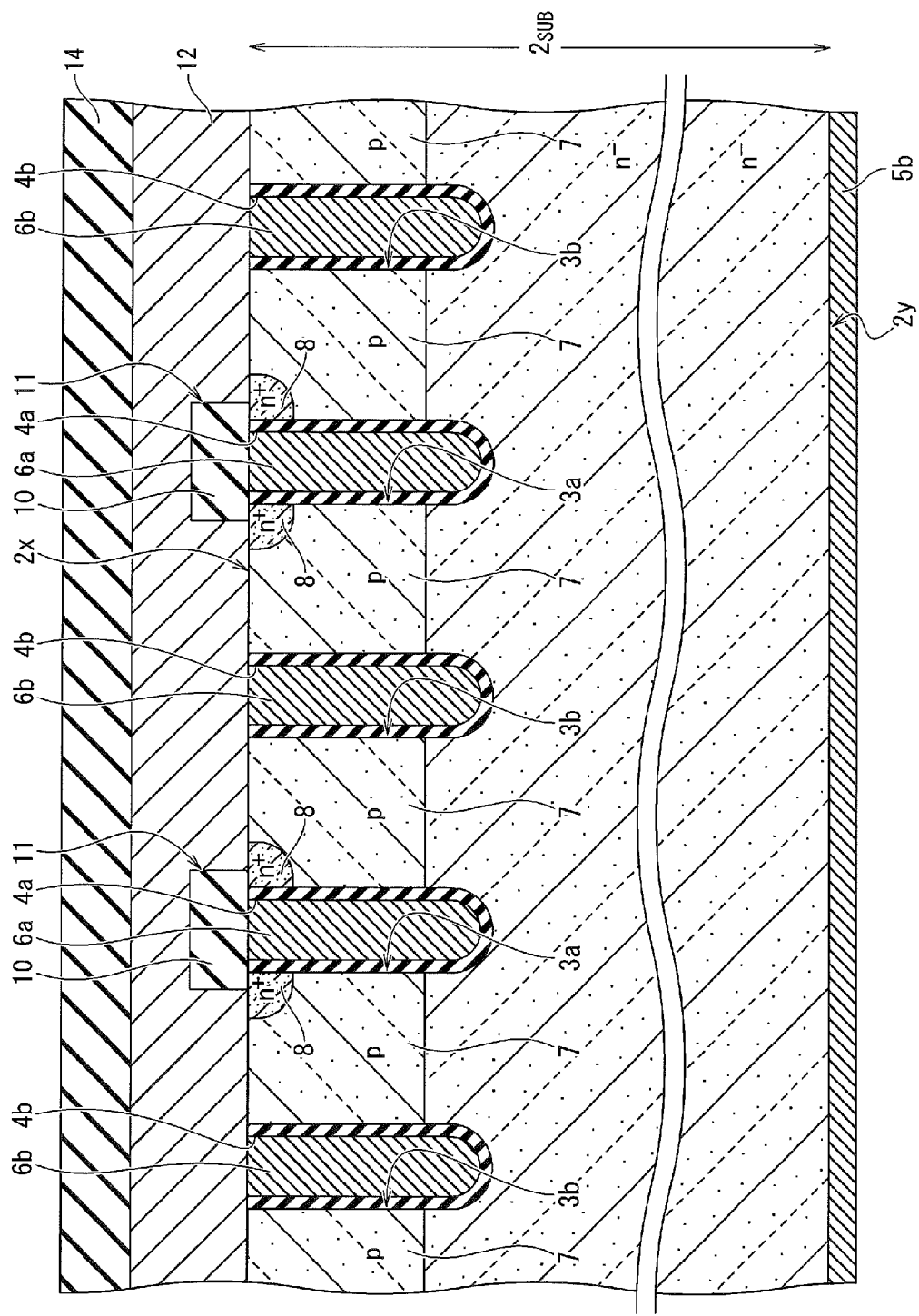
FIG. 18 is a cross-sectional view of the principal part for illustrating the method for manufacturing the semiconductor device according to the first embodiment of the present invention.

(n) Next, as illustrated in FIG. 18, a passivation film 14 made of polyimide-based insulating resin, for example, is coated on the entire top surface 2x of the semiconductor substrate $2_{sub}$ so as to cover the first main electrode 12 and the control electrode 13. Subsequently, the passivation film 14 is delineated by etching, so as to cut a first main electrode-bonding opening to expose a part of the first main electrode 12, and a control electrode-bonding opening to expose a part of the control electrode 13. The passivation film 14 is divided into portions corresponding to the respective chip-forming areas 21 illustrated in FIGS. 3A and 3B. The first main electrode-bonding opening and the control electrode-bonding opening are assigned in each of the chip-forming areas 21 illustrated in FIGS. 3A and 3B.

Figure 19:
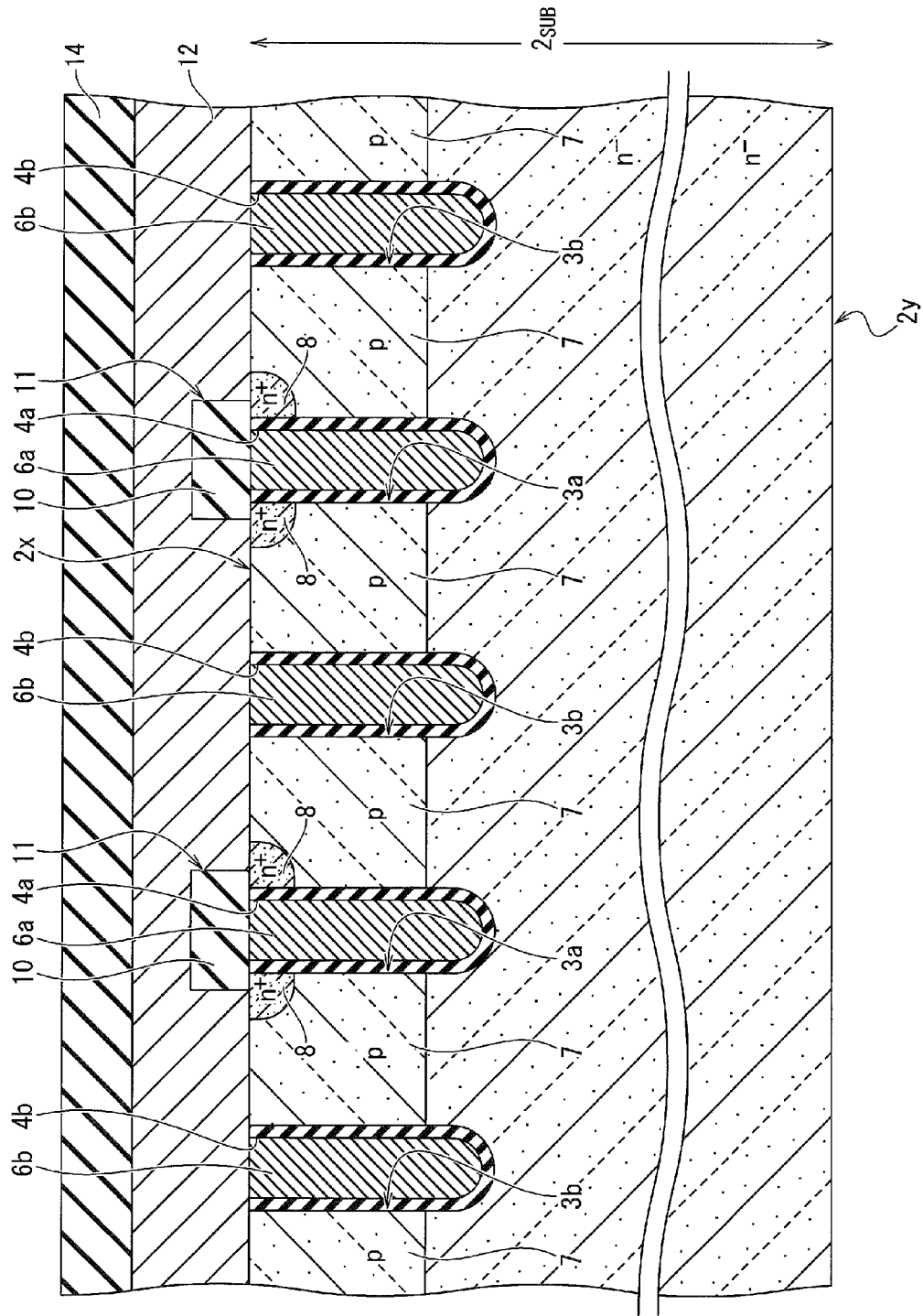
FIG. 19 is a cross-sectional view of the principal part for illustrating the method for manufacturing the semiconductor device according to the first embodiment of the present invention.

(o) Next, the thickness of the semiconductor substrate $2_{sub}$ is reduced such that the bottom surface 2y of the semiconductor substrate $2_{sub}$ is ground by a back grinding method or a chemical mechanical polishing (CMP) method, for example. In this step, the second conductive film 5b on the bottom surface 2y of the semiconductor substrate $2_{sub}$ is removed, as illustrated in FIG. 19.

Figure 20:
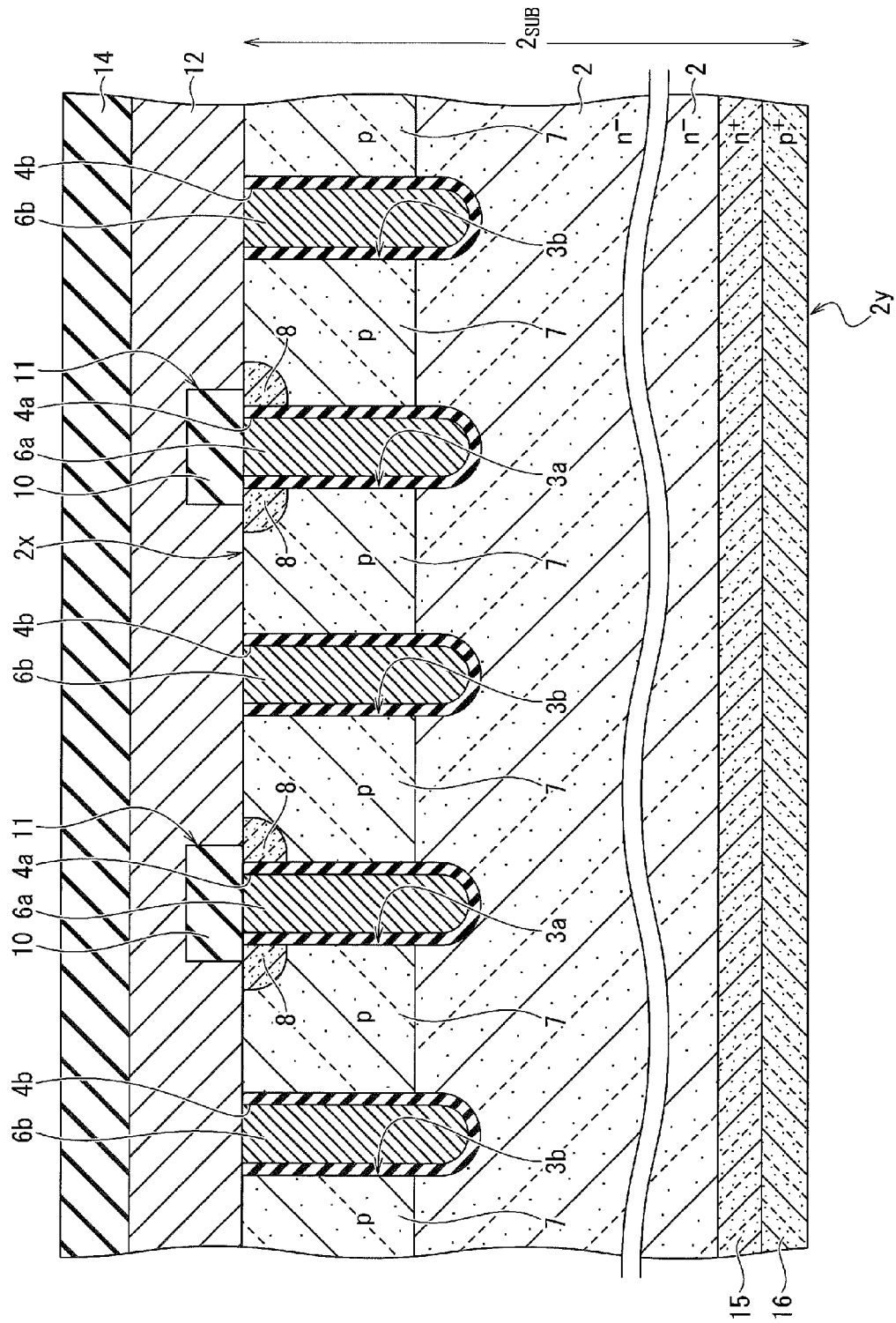
FIG. 20 is a cross-sectional view of the principal part for illustrating the method for manufacturing the semiconductor device according to the first embodiment of the present invention.

(p) Next, as illustrated in FIG. 20, an $n^+$-type buffer layer 15 and a $p^+$-type second main electrode region 16 are formed on the surface layer of the bottom surface 2y of the semiconductor substrate $2_{sub}$. The buffer layer 15 and the second main electrode region 16 are formed such that n-type impurity ions and p-type impurity ions are sequentially implanted to the bottom surface 2y of the semiconductor substrate $2_{sub}$, followed by annealing so as to activate the implanted impurity ions. For example, phosphorus ions are implanted as the n-type impurity ions, and boron ions are implanted as the p-type impurity ions.

The buffer layer 15 is formed at a position deeper than the second main electrode region 16 in the depth direction from the bottom surface 2y of the semiconductor substrate $2_{sub}$. The residual semiconductor substrate $2_{sub}$ thus serves as the drift layer 2. Although not illustrated in detail in FIG. 20, the buffer layer 15 and the second main electrode region 16 are formed on the bottom surface 2y of the semiconductor substrate $2_{sub}$ along the respective chip-forming areas 21 illustrated in FIGS. 3A and 3B.

(q) Next, the second main electrode 17 is laminated on the entire bottom surface 2y of the semiconductor substrate $2_{sub}$, and electrically and metallurgically connected to the second main electrode region 16 so as to obtain low ohmic-contact resistance. Accordingly, the wafer process for the semiconductor device according to the first embodiment is substantially finished. The semiconductor substrate $2_{sub}$ is divided into a plurality of chip-forming areas 21 by dicing the scribing lanes 22 of the semiconductor substrate $2_{sub}$ with a dicing blade. The semiconductor chip 20 implemented by the chip-forming area 21 as illustrated in FIG. 1 is thus completed.

As described above, according to the method for manufacturing the semiconductor device pertaining to the first embodiment of the present invention, regardless of the dummy trenches and the dummy electrodes, abnormal shape of each of the first trenches 3a and the second trenches 3b, and quality-degradation of the insulating film 4 (the later first insulating films 4a) between the first trenches 3a and the first conductive film 5a (the later gate electrodes 6a) and the insulating film 4 (the later second insulating films 4b) between the second trenches 3b and the first conductive film 5a (the later separated-electrodes 6b), can be screened out by the voltage application. Accordingly, appropriate screening of defective chips can be performed during the process of manufacturing the semiconductor device having a trench gate structure including the gate electrodes 6a and the separated-electrodes 6b serving as dummy electrodes not contributing to the formation of channels.

According to the method for manufacturing the semiconductor device pertaining to the first embodiment of the present invention, the second conductive film 5b serving as an electrode to which the voltage is applied from the negative electrode side of the power supply 27, is provided on the entire bottom surface 2y of the semiconductor substrate $2_{sub}$. As compared with the case in which the electrode to which the voltage is applied from the negative electrode side of the power supply 27 is provided on the top surface 2x of the semiconductor substrate $2_{sub}$, a crowding of the electric field applied to the insulating film 4 between the first conductive film 5a and the semiconductor substrate $2_{sub}$, including the inside of the first trenches 3a and the inside of the second trenches 3b, can be suppressed. Accordingly, stress can be applied evenly to the entire insulating film 4.

With regard to the screening of defective chips of quality-degradation of the insulating films inside of the dummy trenches by the voltage application, an earlier method is known in which an independent pad is electrically connected to a dummy electrode inside of a dummy trench, a voltage is applied between the independent pad and an emitter electrode, and thereafter, the independent pad and the emitter electrode is electrically connected with a wire in the assembling process. However, the earlier method requires the additional independent pad or a runner electrically connecting the independent pad to the dummy electrode inside of the dummy trench. As a result, the area of an active-element arrangement area decreases, as compared with a chip having the same size, and the number of assembling steps increases.

The method for manufacturing the semiconductor device according to the first embodiment of the present invention can perform appropriate screening of defective chips without the addition of an independent pad or a runner connecting the independent pad to a dummy electrode inside of a dummy trench. Accordingly, a decrease of the area of the respective active-element arrangement areas 21 and an increase of assembling steps can be prevented.

According to the method for manufacturing the semiconductor device pertaining to the first embodiment of the present invention, the extra spaces at the corners 23 of the chip-forming areas 21 or the scribing lanes 22 are designed for positions configured to contact the probe needle 28 to the first conductive film 5a when applying the voltage between the first conductive film 5a and the bottom surface 2y of the semiconductor substrate $2_{sub}$. Accordingly, a decrease of the manufacturing yield can be prevented even if patterns ascribable to etch residues are generated when the first conductive film 5a is etched afterward to form the gate electrodes 6a and the separated-electrodes 6b.

Second Embodiment

With reference to FIGS. 21A to 24, a method for manufacturing a semiconductor device according to a second embodiment of the present invention will be described below. The method for manufacturing the semiconductor device according to the second embodiment is substantially the same as the method for manufacturing the semiconductor device according to the first embodiment, except for the step of etching the conductive film 5 and the step of testing the insulating characteristics of the insulating film 4. The method for manufacturing the semiconductor device according to the second embodiment is described especially with regard to a first etching step of etching the conductive film 5, while omitting specific explanations of the other steps below.

Figure 21A:
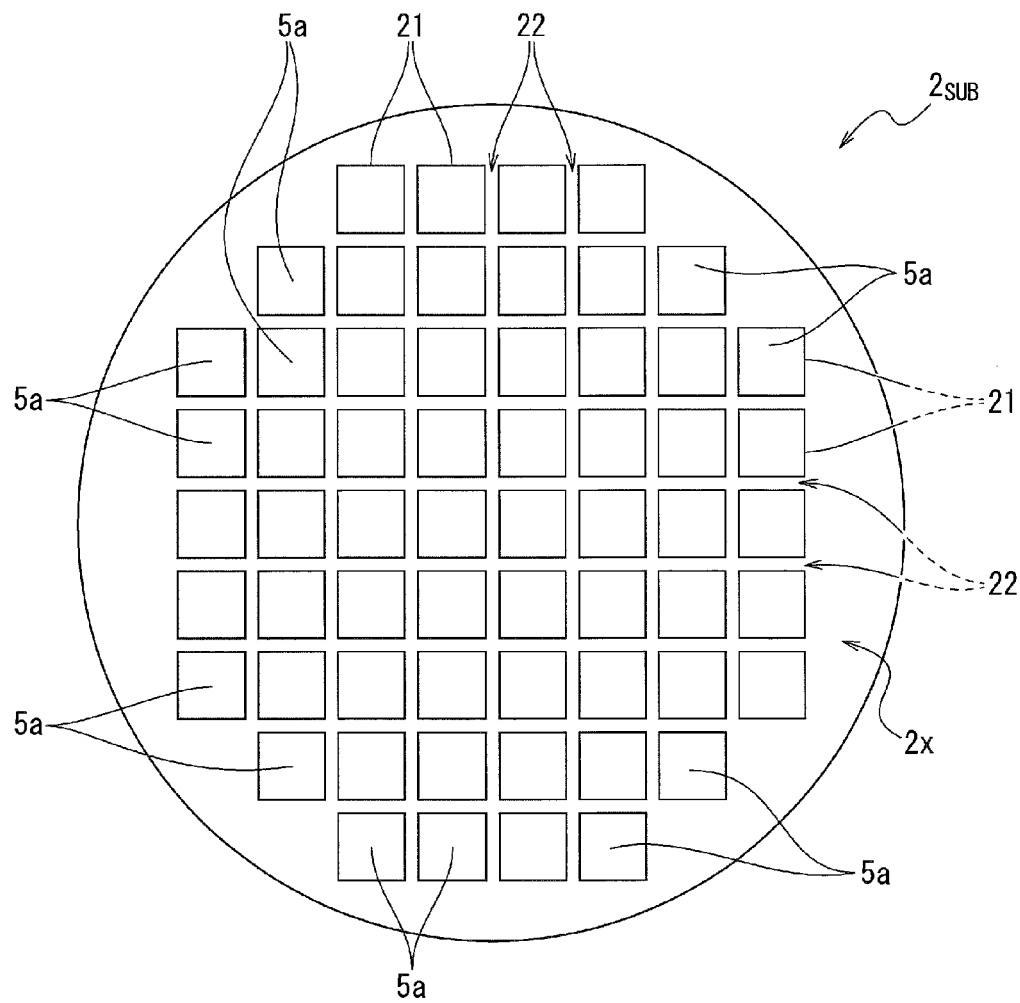
FIG. 21A is a plan view illustrating a method for manufacturing a semiconductor device according to a second embodiment of the present invention.
Figure 21B:
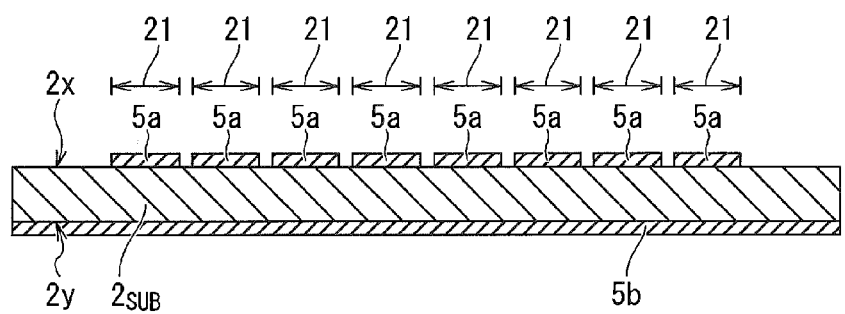
FIG. 21B is a cross-sectional view illustrating a method for manufacturing a semiconductor device according to a second embodiment of the present invention.
Figure 22:
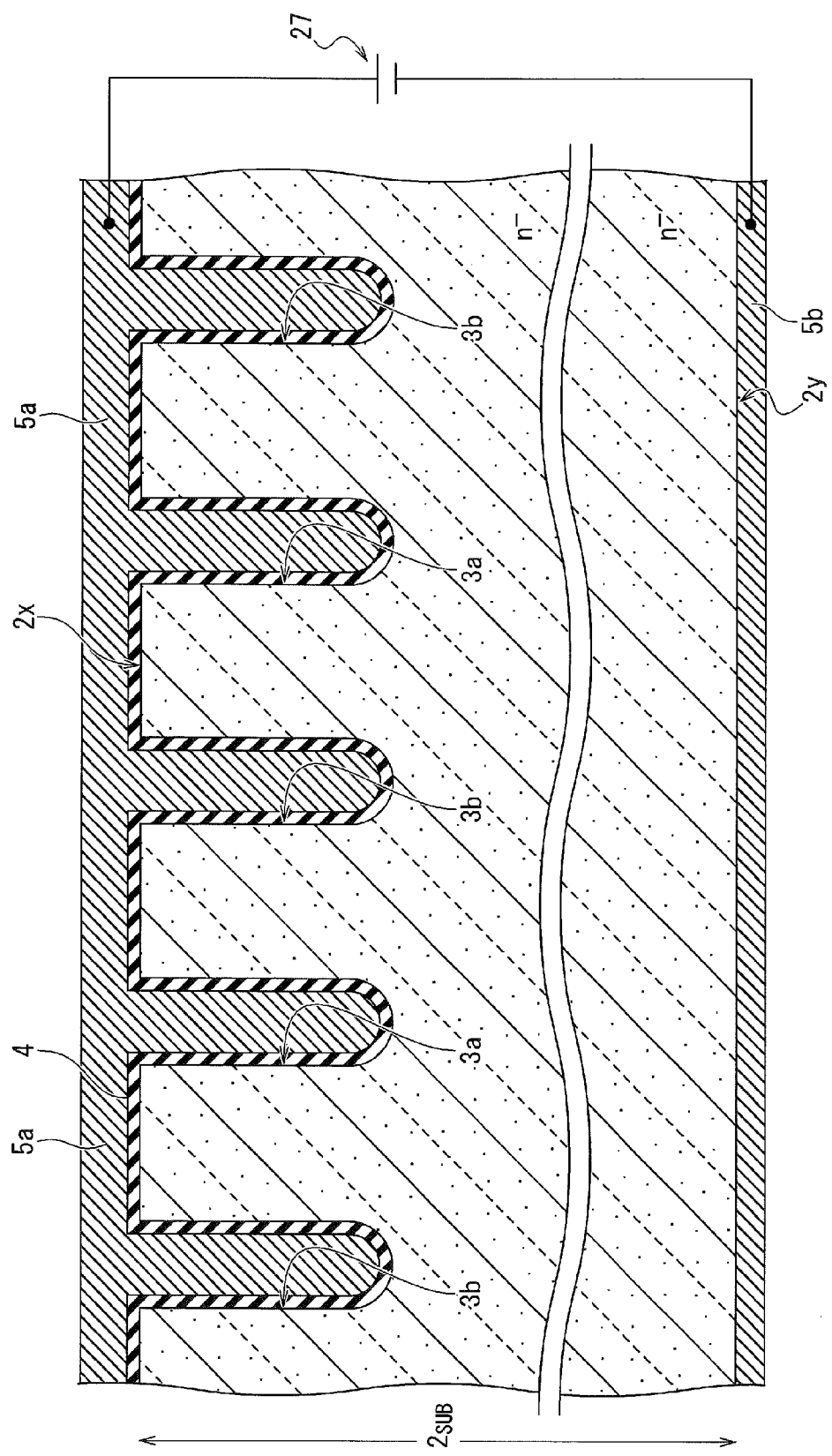
FIG. 22 is a cross-sectional view of a principal part for illustrating the method for manufacturing the semiconductor device according to the second embodiment of the present invention.
Figure 23:
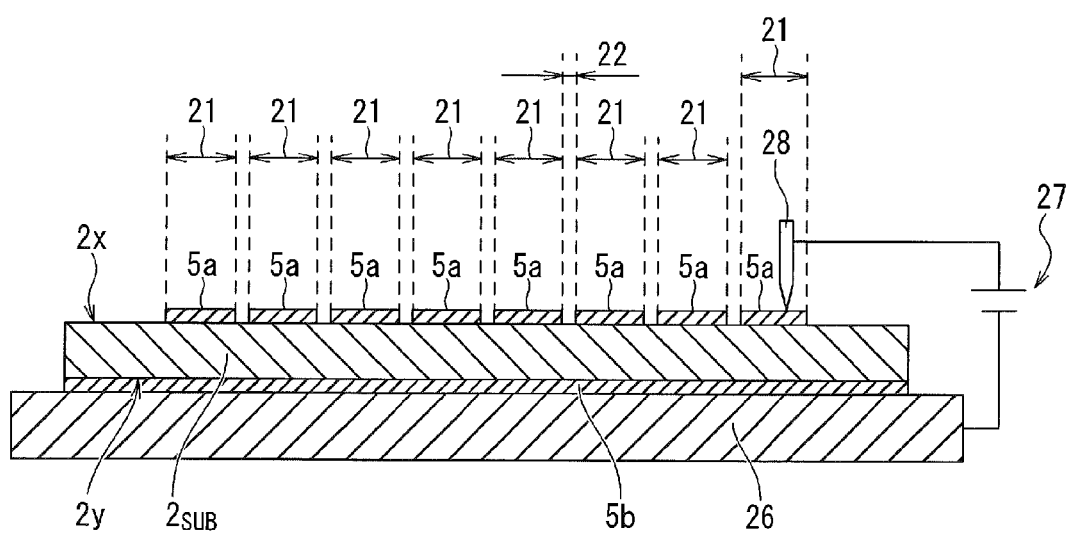
FIG. 23 is a cross-sectional view of the principal part for illustrating the method for manufacturing the semiconductor device according to the second embodiment of the present invention.

FIGS. 21A and 21B illustrates the entire semiconductor substrate in a wafer state before diced into a plurality of chips. FIG. 22 is a cross-sectional view of a principal part of a chip-forming area defined in the semiconductor substrate in the wafer state. FIG. 23 is a cross-sectional view of a principal part illustrating a state in which the semiconductor substrate is arranged on a conductive test-stage.

(a2) First, an n⁻-type semiconductor substrate $2_{sub}$ made of single crystalline silicon is prepared as a base-body portion. Subsequently, triple FLR regions 19 as illustrated in FIG. 5, a plurality of first trenches 3a and a plurality of second trenches 3b as illustrated in FIG. 6, and an insulating film 4 and a conductive film 5 as illustrated in FIGS. 7, 8A and 8B are formed through the steps similar to those in the first embodiment.

(b2) Next, the conductive film 5 is selectively removed by etching from the top surface 2x of the semiconductor substrate $2_{sub}$, excluding the chip-forming areas 21, and the side surface of the semiconductor substrate $2_{sub}$. As illustrated in FIGS. 21A and 21B, the conductive film 5 covering the entire semiconductor substrate $2_{sub}$ is thus divided into a first conductive film 5a on the top surface 2x side of the semiconductor substrate $2_{sub}$ and a second conductive film 5b on the bottom surface 2y side of the semiconductor substrate $2_{sub}$. The first conductive film 5a is further divided into portions corresponding to the respective chip-forming areas 21.

(c2) Next, as illustrated in FIG. 22, the insulating characteristics of the insulating film 4 is tested by applying a voltage between the first conductive films 5a and the bottom surface 2y of the semiconductor substrate $2_{sub}$. In particular, as illustrated in FIG. 23, the semiconductor substrate $2_{sub}$ is arranged on a conductive test-stage 26 so as to face the second conductive film 5b on the bottom surface 2y of the semiconductor substrate $2_{sub}$ to the test-stage 26. The negative electrode side of a power supply 27 is electrically connected to the test-stage 26, and a tip of a probe needle 28 electrically connected to the positive electrode side of the power supply 27 is pressed against the first conductive films 5a.

A higher voltage as compared with a case in normal operation is then applied between the first conductive film 5a and the bottom surface 2y of the semiconductor substrate $2_{sub}$ so as to subject the gate-voltage shock testing under the same conditions as in the first embodiment, and a leakage current of the insulating film 4 is then measured. In the second embodiment, since the first conductive film 5a on the top surface side of the semiconductor substrate $2_{sub}$ is divided in the respective chip-forming areas 21, the pressure contact of the tip of the probe needle 28 against the first conductive film 5a is performed on each of the chip-forming areas 21.

In this step, as illustrated in FIGS. 22 and 23, the electric field is applied to the entire insulating film 4 located between the first conductive film 5a and the semiconductor substrate $2_{sub}$, including the inside of the first trenches 3a and the inside of the second trenches 3b, in each of the chip-forming areas 21. As a result, stress can be applied to the entire insulating film 4 in each of the chip-forming areas 21, respectively. When a leakage current between the first conductive film 5a and the semiconductor substrate $2_{sub}$ is a reference value or higher, the insulating film 4 can be determined as being degraded. Therefore, it is possible to test the insulating characteristics of the insulating film 4 in each of the chip-forming areas 21.

In the second embodiment, regardless of the dummy trenches and the dummy electrodes, the abnormal shape of each of the first trenches 3a and the second trenches 3b, the quality-degradation of the insulating film 4 (the later first insulating films 4a) between the first trenches 3a and the first conductive film 5a (the later gate electrodes 6a), and the quality-degradation of the insulating film 4 (the later second insulating films 4b) between the second trenches 3b and the first conductive film 5a (the later separated-electrodes 6b), can be screened out by the voltage application in each of the chip-forming areas 21.

In the screening step, the second conductive film 5b serving as an electrode to which the voltage is applied from the negative electrode side of the power supply 27, is laminated on the entire bottom surface 2y of the semiconductor substrate $2_{sub}$. Similar to the case of the first embodiment, a crowding of the electric field applied to the insulating film 4 between the first conductive film 5a and the semiconductor substrate $2_{sub}$, including the inside of the first trenches 3a and the inside of the second trenches 3b, can be suppressed. Accordingly, stress can be applied evenly to the entire insulating film 4 in each of the chip-forming areas 21, respectively.

Figure 24:
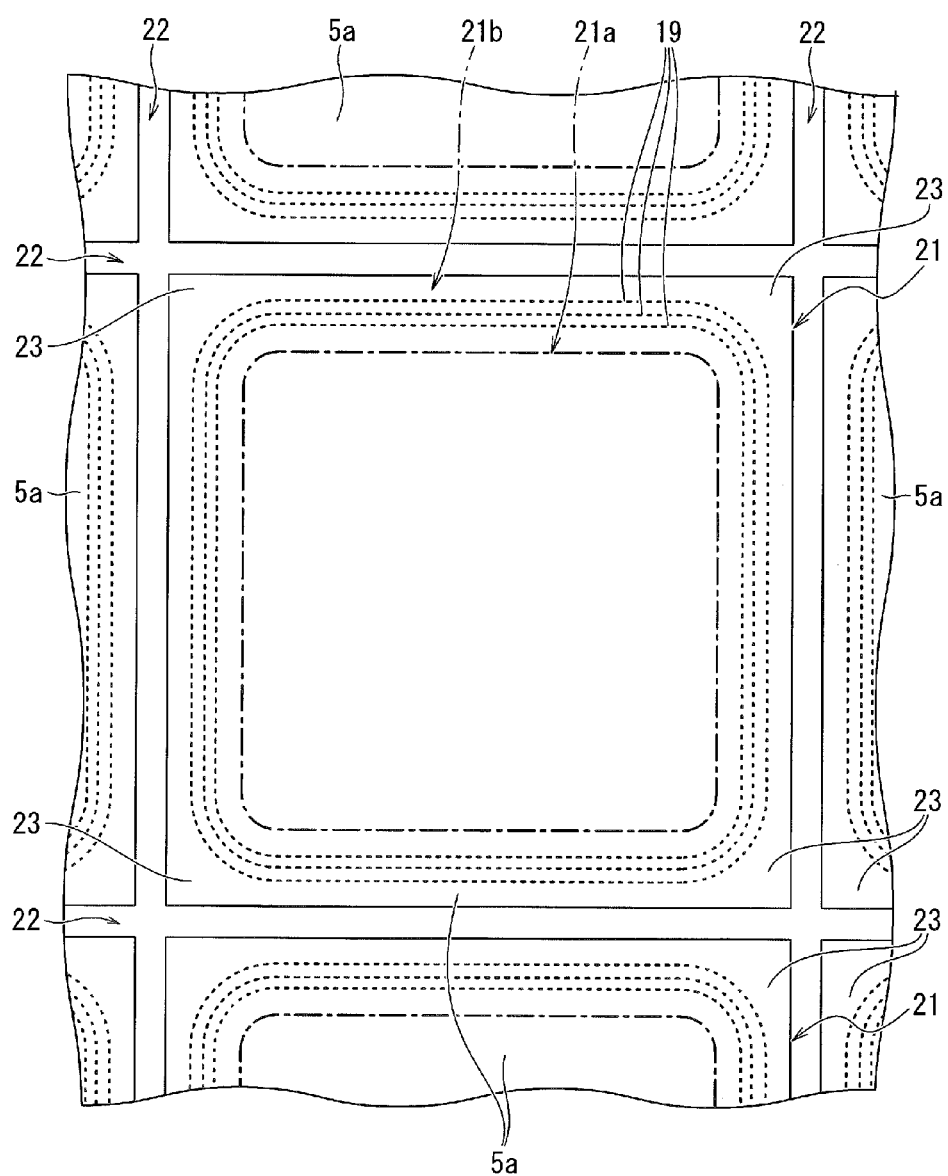
FIG. 24 is a plan view of the principal part for illustrating the method for manufacturing the semiconductor device according to the second embodiment of the present invention.

In the second embodiment, as illustrated in FIG. 24, since the first conductive film 5a is not provided in the scribing lanes 22, the tip of the probe needle 28 is preferably pressed against the first conductive film 5a provided at corners 23 of the chip-forming area 21. Also in the second embodiment, similar to the first embodiment, it is possible to easily contact the tip of the probe needle 28 with the first conductive film 5a without damage to the FLR regions 19.

Thereafter, through the steps similar to those in the first embodiment, the gate electrodes 6a, the separated-electrodes 6b, the first insulating films 4a, the second insulating films 4b, the p-type base region 7, the n⁺-type first main electrode regions 8, the interlayer insulating film 10, the contact holes 11, the first main electrode 12, the control electrode 13, the passivation film 14, the first main electrode-bonding opening, the control electrode-bonding opening, the n⁺-type buffer layer 15, the p⁺-type second main electrode region 16, and the second main electrode 17 are formed, including the grounding process of the bottom surface 2y of the semiconductor substrate $2_{sub}$. Accordingly, the wafer process for the semiconductor device according to the second embodiment is substantially finished.

As described above, according to the method for manufacturing the semiconductor device pertaining to the second embodiment, regardless of the dummy trenches and the dummy electrodes, the abnormal shape of each of the first trenches 3a and the second trenches 3b, the quality-degradation of the insulating film 4 between the first trenches 3a and the first conductive film 5a, and the quality-degradation of the insulating film 4 between the second trenches 3b and the first conductive film 5a can be screened out by the voltage application in each of the chip-forming areas 21, respectively. Accordingly, appropriate screening of defective chips can be assigned in each of the chip-forming areas 21 during the process of manufacturing the semiconductor device having a trench gate structure including the gate electrodes 6a and the separated-electrodes 6b serving as dummy electrodes not contributing to the formation of channels.

According to the method for manufacturing the semiconductor device according to the second embodiment of the present invention, the second conductive film 5b serving as an electrode to which the voltage is applied from the negative electrode side of the power supply 27, is laminated on the entire bottom surface 2y of the semiconductor substrate $2_{sub}$. As compared with the earlier case in which the electrode to which the voltage is applied from the negative electrode side of the power supply 27 is laminated on the top surface 2x of the semiconductor substrate $2_{sub}$, a crowding of the electric field applied to the insulating film 4 between the first conductive film 5a and the semiconductor substrate $2_{sub}$, including the inside of the first trenches 3a and the inside of the second trenches 3b, can be suppressed in each of the chip-forming areas 21 by the method for manufacturing the semiconductor device according to the second embodiment. Accordingly, stress can be applied evenly to the entire insulating film 4 in each of the chip-forming areas 21 by the method for manufacturing the semiconductor device according to the second embodiment.

Similar to the case of the first embodiment, the method for manufacturing the semiconductor device according to the second embodiment of the present invention can perform appropriate screening of defective chips without the addition of an independent pad or a runner connecting the independent pad to a dummy electrode inside a dummy trench. Accordingly, a decrease of the area of the respective active-element arrangement areas 21 or an increase of assembling steps can be suppressed.

According to the method for manufacturing the semiconductor device pertaining to the second embodiment of the present invention, the extra spaces at the corners 23 of the chip-forming areas 21 are designed for positions configured to contact the probe needle 28 with the first conductive films 5a when applying the voltage between the first conductive films 5a and the bottom surface 2y of the semiconductor substrate $2_{sub}$. By setting the extra spaces at the corners 23, similar to the first embodiment, a decrease of the manufacturing yield can be prevented even if patterns ascribable to etch residues are generated when the first conductive films 5a are etched afterward to form the gate electrodes 6a and the separated-electrodes 6b.

Figure 25:
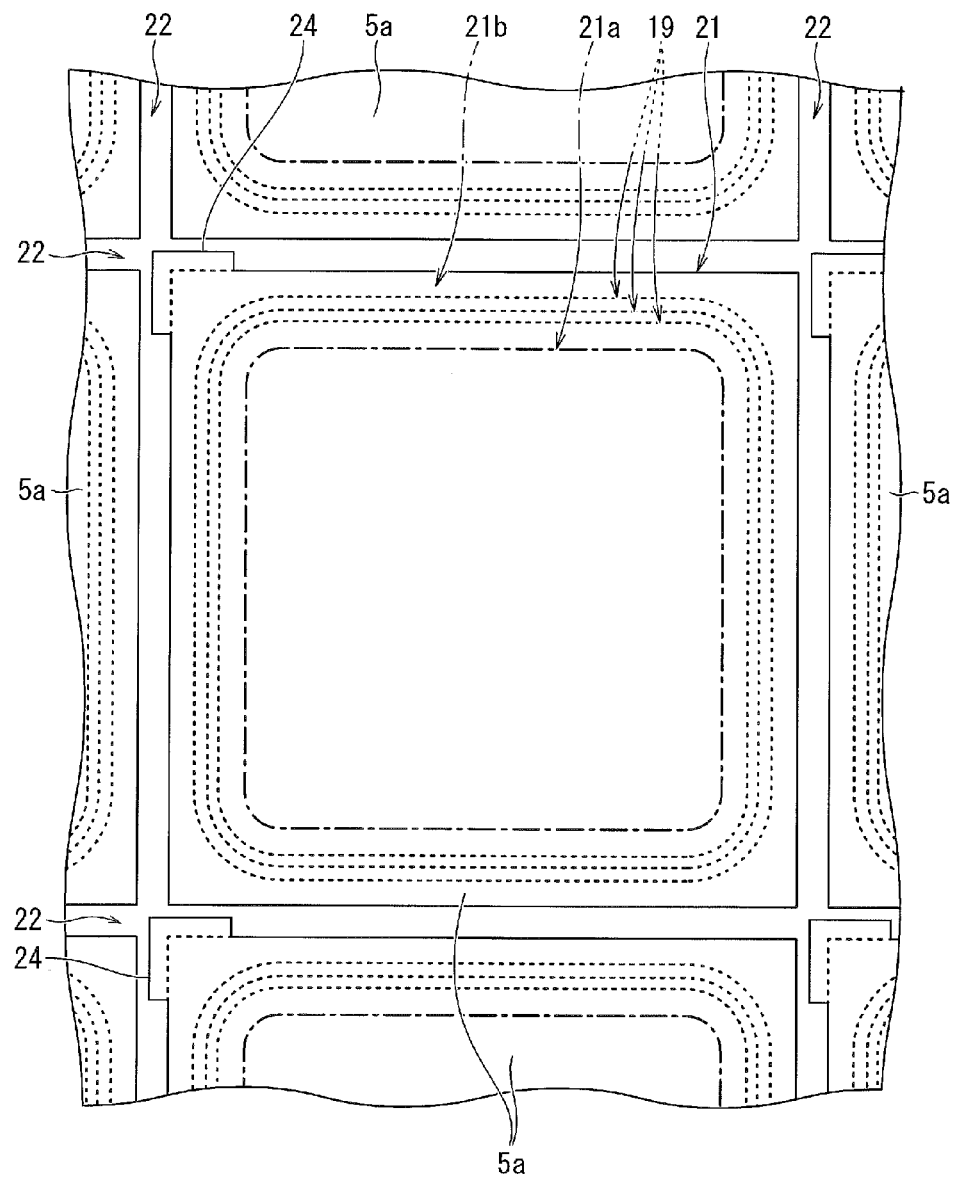
FIG. 25 is a plan view of the principal part for illustrating the modified example of the method for manufacturing the semiconductor device according to the second embodiment of the present invention.

When the conductive film 5 is selectively removed by etching so as to divide the conductive film 5 into a plurality of first conductive films 5a corresponding to the respective chip-forming areas 21, each of the first conductive films 5a may be divided to have a pad portion 24 protruding into the scribing lane 22, as illustrated in FIG. 25. By providing the pad portion 24 protruding into the scribing lane 22, similar to the first embodiment, a decrease of the manufacturing yield can be prevented even if patterns ascribable to etch residues are generated when the first conductive films 5a are etched afterward to form the gate electrodes 6a and the separated-electrodes 6b.

Third Embodiment

Figure 26A:
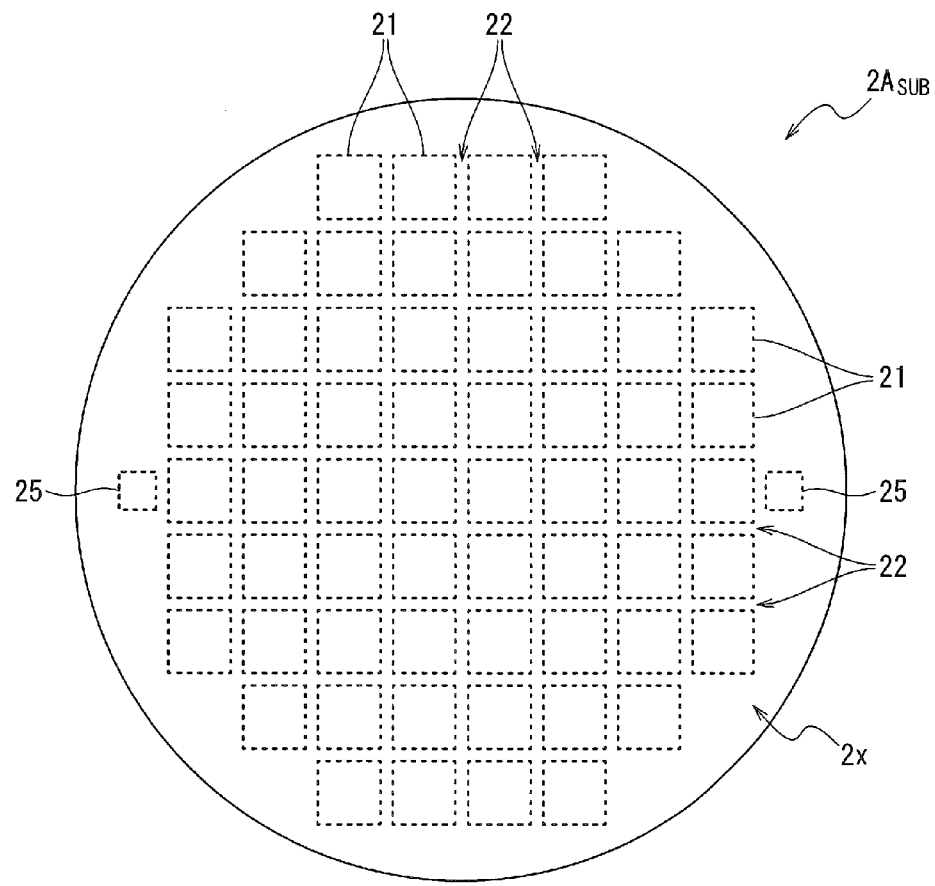
FIG. 26A is a plan view illustrating a method for manufacturing a semiconductor device according to a third embodiment of the present invention.

With reference to FIGS. 26A to 31, a method for manufacturing a semiconductor device according to a third embodiment of the present invention will be described below. The method for manufacturing the semiconductor device according to the third embodiment uses a semiconductor substrate $2A_{sub}$ as illustrated in FIGS. 26A and 26B. The semiconductor substrate $2A_{sub}$ has substantially the same structure as the semiconductor substrate $2_{sub}$, but differs in including monitor portions 25 (also referred to as a monitoring area 25), although not delineated physically as illustrated in FIGS. 26A and 26B.

The monitor portions 25 are arranged at positions where the chip-forming areas 21 or the scribing lanes 22 are not provided. Similar to the chip-forming areas 21 as illustrated in FIG. 4, each of the monitor portions 25 includes an active-element arrangement area 21a provided with a semiconductor device and a breakdown-voltage improving-area 21b provided with FLR regions 19. The monitor portions 25 are manufactured by the process similar to the chip-forming areas 21.

Figure 28A:
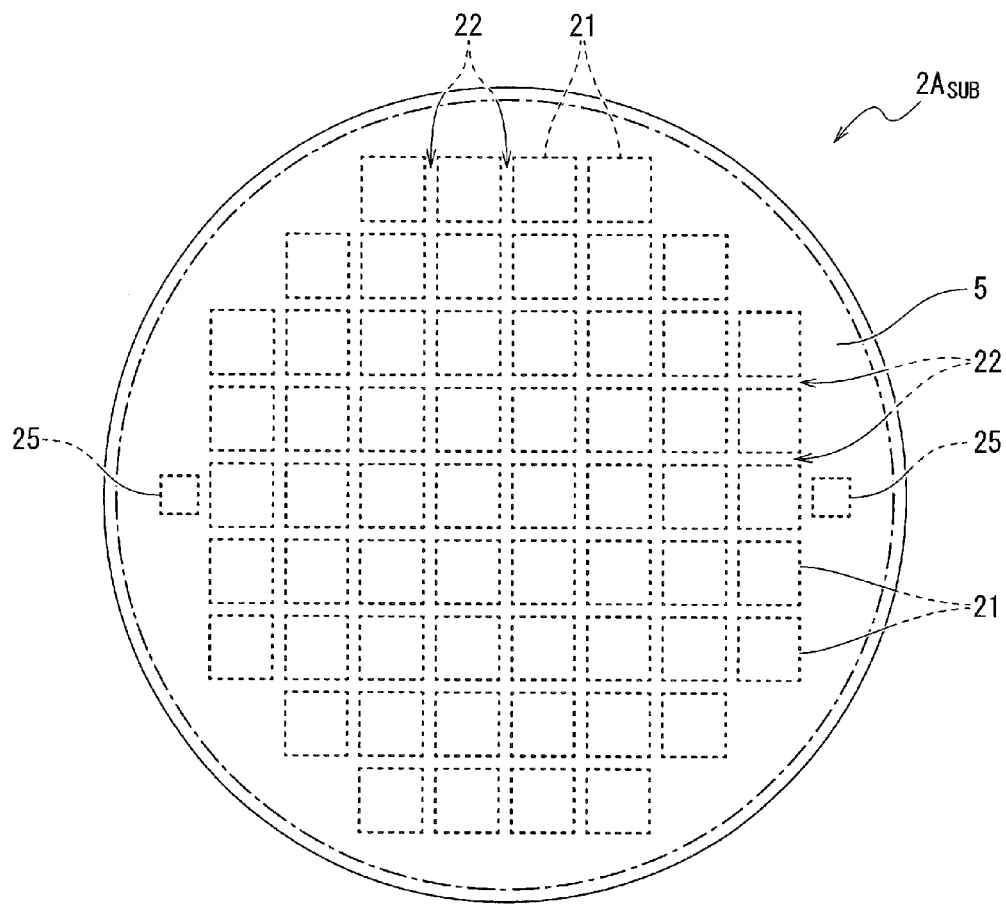
FIG. 28A is a plan view illustrating the method for manufacturing the semiconductor device according to the third embodiment of the present invention.
Figure 28B:
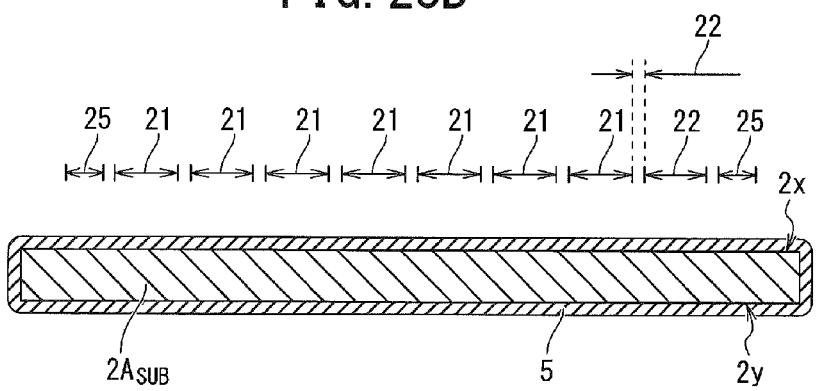
FIG. 28B is a cross-sectional view illustrating the method for manufacturing the semiconductor device according to the third embodiment of the present invention.
Figure 29A:
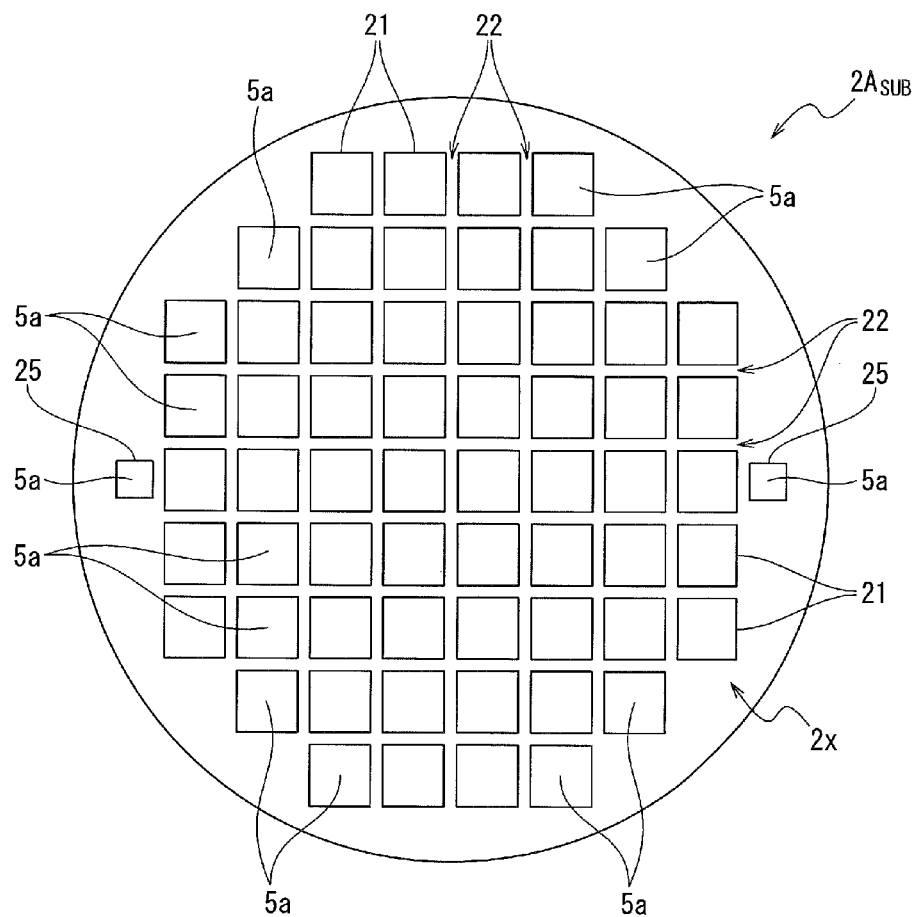
FIG. 29A is a plan view illustrating the method for manufacturing the semiconductor device according to the third embodiment of the present invention.
Figure 29B:
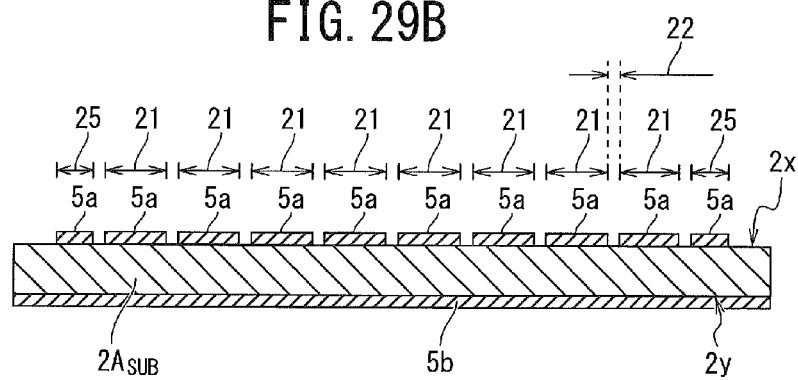
FIG. 29B is a cross-sectional view illustrating the method for manufacturing the semiconductor device according to the third embodiment of the present invention.
Figure 30:
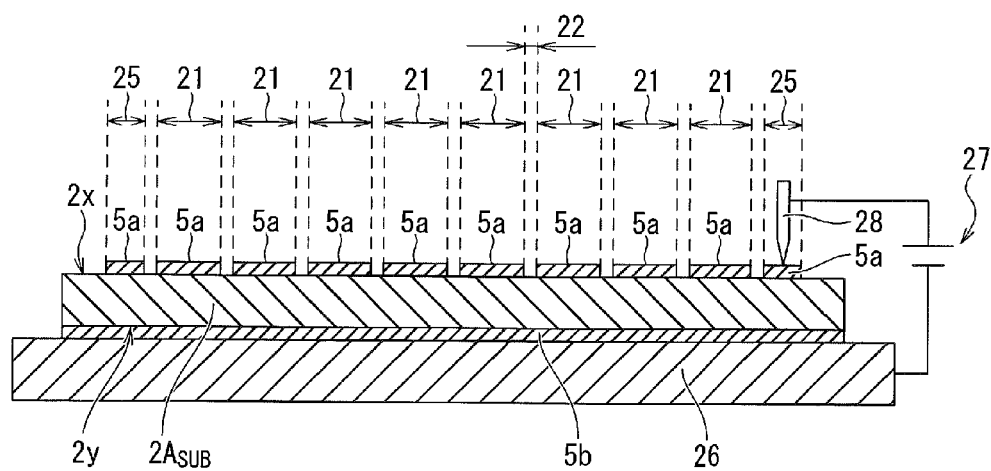
FIG. 30 is a cross-sectional view of a principal part for illustrating the method for manufacturing the semiconductor device according to the third embodiment of the present invention.
Figure 31:
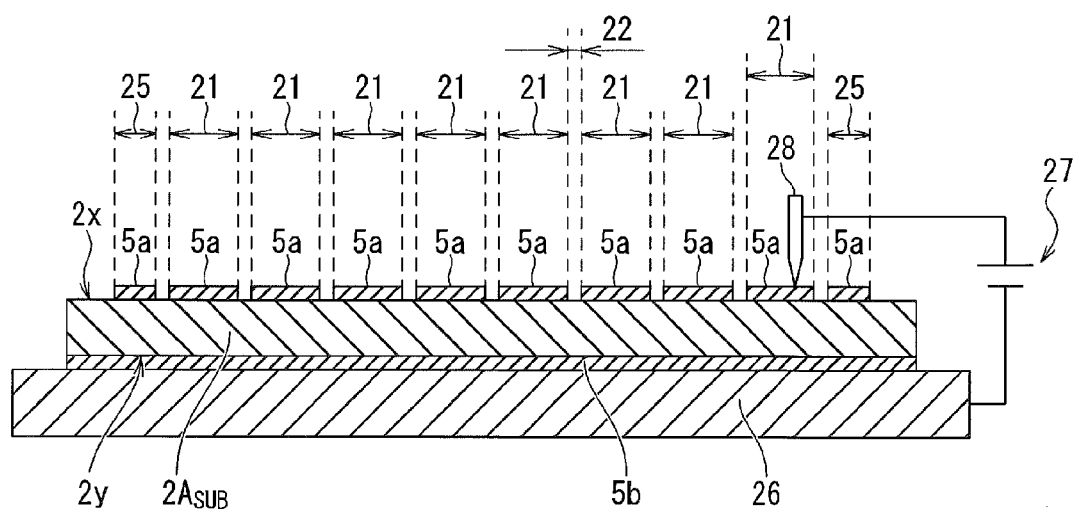
FIG. 31 is a cross-sectional view of the principal part for illustrating the method for manufacturing the semiconductor device according to the third embodiment of the present invention.

FIGS. 26A 26B, 28A, 28B, 29A and 29B illustrate the entire semiconductor substrate in a wafer state before diced into chips. FIG. 27 is a cross-sectional view of a principal part of a chip-forming area defined in the semiconductor substrate in the wafer state. FIGS. 30 and 31 are cross-sectional views of a principal part illustrating a state in which the semiconductor substrate is arranged on a conductive test-stage.

Figure 26B:
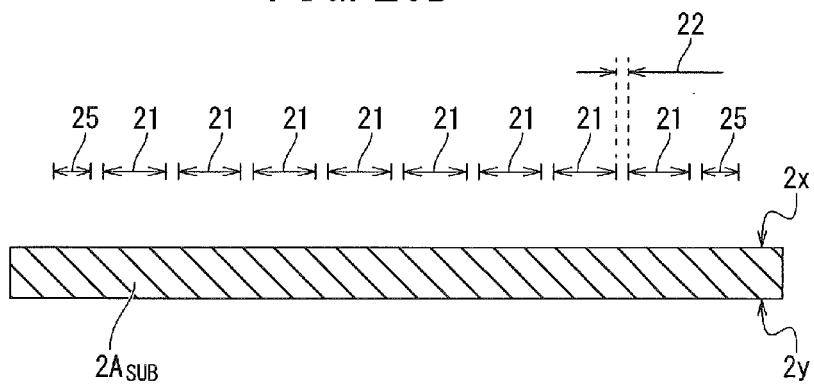
FIG. 26B is a cross-sectional view illustrating a method for manufacturing a semiconductor device according to a third embodiment of the present invention.
Figure 27:
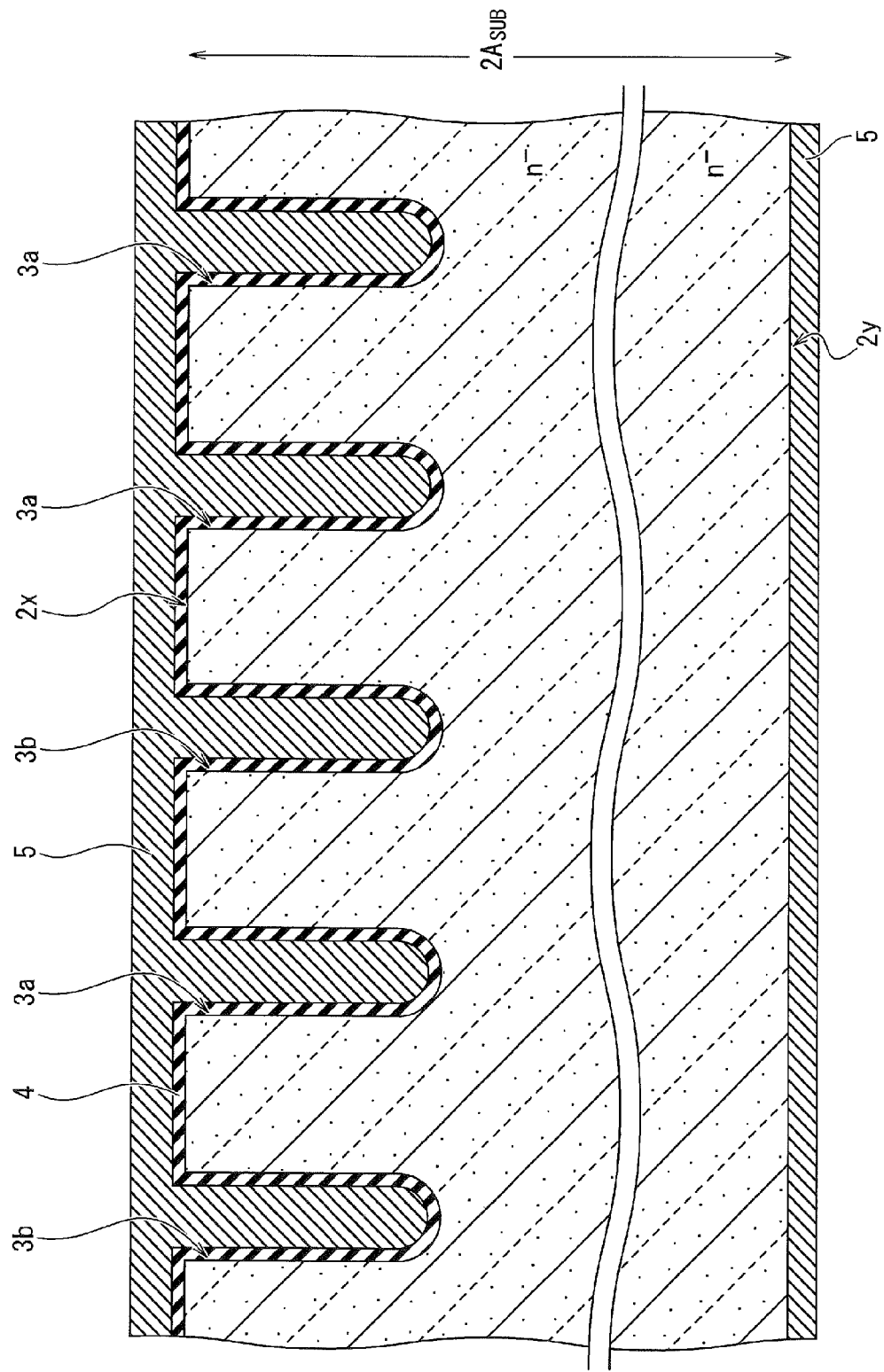
FIG. 27 is a cross-sectional view of a principal part for illustrating the method for manufacturing the semiconductor device according to the third embodiment of the present invention.

(a3) First, as illustrated in FIGS. 26A and 26B, an n⁻-type semiconductor substrate $2A_{sub}$ made of single crystalline silicon is prepared as a base-body portion. Subsequently, triple FLR regions 19 as illustrated in FIG. 5, a plurality of first trenches 3a, a plurality of second trenches 3b, an insulating film 4, and a conductive film 5 as illustrated in FIG. 27 are formed in the respective chip-forming areas 21 of the semiconductor substrate $2A_{sub}$ through the steps similar to those in the first embodiment. The FLR regions 19, the plurality of first trenches 3a, the plurality of second trenches 3b, the insulating film 4, and the conductive film 5 are formed also in the monitor portions 25 of the semiconductor substrate $2A_{sub}$. The conductive film 5 is laminated on the entire semiconductor substrate $2A_{sub}$ as illustrated in FIGS. 28A and 28B.

(b3) Next, the conductive film 5 is selectively removed by etching from the top surface 2x of the semiconductor substrate $2A_{sub}$, excluding the chip-forming areas 21, and the side surface of the semiconductor substrate $2A_{sub}$. As illustrated in FIGS. 29A and 29B, the conductive film 5 covering the entire semiconductor substrate $2A_{sub}$ is thus divided into a first conductive film 5a on the top surface 2x side of the semiconductor substrate $2A_{sub}$ and a second conductive film 5b on the bottom surface 2y side of the semiconductor substrate $2A_{sub}$. The first conductive film 5a is further divided into portions corresponding to the respective chip-forming areas 21 and the monitor portions 25.

(c3) Next, as illustrated in FIG. 30, the semiconductor substrate $2A_{sub}$ is arranged on a conductive test-stage 26 such that the second conductive film 5b on the bottom surface 2y of the semiconductor substrate $2A_{sub}$ faces the test-stage 26. The negative electrode side of a power supply 27 is electrically connected to the test-stage 26, and a tip of a probe needle 28 electrically connected to the positive electrode side of the power supply 27 is pressed against the first conductive films 5a of the monitor portions 25. A high voltage for causing dielectric breakdown of the insulating film 4 is then applied between the first conductive film 5a of the monitor portion 25 and the bottom surface 2y of the semiconductor substrate $2A_{sub}$. In this step, it is possible to confirm whether the bottom surface 2y of the semiconductor substrate $2A_{sub}$ and the test-stage 26 are electrically connected to each other, by measuring a breakdown voltage at which the dielectric breakdown of the insulating film 4 occurs.

(d3) Next, as illustrated in FIG. 31, the insulating characteristics of the insulating film 4 is tested by applying a voltage between the first conductive films 5a of the chip-forming areas 21 and the bottom surface 2y of the semiconductor substrate $2A_{sub}$, in a manner similar to the second embodiment. By performing the subsequent steps similar to those in the first embodiment, the wafer process for the semiconductor device according to the third embodiment is substantially finished.

As described above, according to the method for manufacturing the semiconductor device pertaining to the third embodiment of the present invention, after the electrical connection between the bottom surface 2y of the semiconductor substrate $2A_{sub}$ and the test-stage 26 is confirmed, the insulating characteristics of the insulating film 4 can be tested by applying a voltage between the first conductive films 5a of the chip-forming areas 21 and the bottom surface 2y of the semiconductor substrate $2A_{sub}$. The testing scheme of the third embodiment can prevent the testing failure such that the insulating characteristics is tested without stress is applied to the insulating film 4, because of connection failure between the bottom surface 2y of the semiconductor substrate $2A_{sub}$ and the test-stage 26. Accordingly, the reliability of the screening of defective chips by the voltage application can be increased.

Although the third embodiment illustrates the monitor portions 25 arranged at the positions where the chip-forming areas 21 or the scribing lanes 22 are not provided, the monitor portions 25 may be arranged in the scribing lanes 22.

Other Embodiments

While the present invention has been described above with reference to the first to third embodiments, it should be understood that the present invention is not intended to be limited to the descriptions of the first to third embodiments, and various modifications may be made without departing from the scope of the present invention.

For example, although the first to third embodiments have exemplified the method for manufacturing the IGBT as a semiconductor device having a trench gate structure, the present invention is not limited to the IGBT, and may be applicable to a method for manufacturing a semiconductor device including a power MOSFET having a trench gate structure.

The method for manufacturing the single crystalline silicon wafer implementing the respective semiconductor substrates $2_{sub}$ and $2A_{sub}$ according to the first to third embodiments may be a floating zone (FZ) method, a Czochralski (CZ) method, or a magnetic Czochralski (MCZ) method. The methods for manufacturing the semiconductor devices according to the first to third embodiments may be applicable to any single crystalline silicon wafer obtained by any of the methods listed above.

The methods for manufacturing the semiconductor devices according to the first to third embodiments may be applicable to the semiconductor substrates $2_{sub}$ and $2A_{sub}$ implemented by a single crystalline silicon wafer obtained by the MCZ method. As compared with a wafer obtained by the FZ method, the single crystalline silicon wafer obtained by the MCZ method may easily cause defects such as abnormal shape of dummy trenches or degradation of insulating films between dummy trenches and electrodes. In other words, the single crystalline silicon wafer obtained by the MCZ method has a high concentration of impurities such as carbon and oxygen incorporated during the wafer production, as compared with the single crystalline silicon wafer obtained by the FZ method. For this reason, the wafer obtained by the MCZ tends to easily cause crystal defects derived from the impurities. These impurities or crystal defects lead to the defects of abnormal shape of the dummy trenches or quality-degradation of the insulating films inserted between the dummy trenches and the electrodes. Thus, when the methods for manufacturing the semiconductor devices according to the first to third embodiments are applied to the semiconductor substrates $2_{sub}$ and $2A_{sub}$ implemented by the single crystalline silicon wafer obtained by the MCZ method, the effectiveness of screening of the defective portions described above is remarkably enhanced.

The method for manufacturing the semiconductor device according to the present invention can perform appropriate screening of defective chips in the process of manufacturing a semiconductor device having a trench gate structure, by providing dummy electrodes not contributing to the formation of channels. Accordingly, the present invention is effectively applicable to a method for manufacturing a semiconductor device having a trench gate structure.

What is claimed is:

1. A method for manufacturing a semiconductor device, comprising:
   digging first and second trenches at a top surface of a plate-shaped base-body portion;
   forming an insulating film in an inside of each of the first and second trenches;
   laminating a first conductive film on the top surface of the base-body portion so as to bury the first and second trenches with the conductive film via the insulating film;
   laminating a second conductive film on a bottom surface of the base-body portion;
   testing insulation characteristics of the insulating film by applying a voltage between the first conductive film and the second conductive film;

after the testing the insulation-characteristics, selectively removing the first conductive film, so as to define a gate electrode in the first trench and a separated-electrode in the second trench, the separated-electrode being separated from the gate electrode;

after the testing the insulation-characteristics, removing the second conductive film; and after removing the second conductive film, laminating a collector electrode on the bottom surface of the base-body portion.

2. The method of claim 1, wherein:
the base-body portion includes a plurality of chip-forming areas demarcated by scribing lanes;
the first and second trenches are dug in each of the plurality of chip-forming areas; and
the first conductive film is laminated in blanket over the plurality of chip-forming areas.

3. The method of claim 1, wherein
to form the first conductive film on the top surface of the base-body portion and to form the second conductive film on the bottom surface of the base-body portion, the method comprises:
laminating a continuous conductive film having a first portion laminated along the top surface of the base-body portion and a second portion laminated along the bottom surface of the base-body portion; and
dividing the continuous conductive film so as to separate the first and second portions from each other, the first portion thereby being formed as the first conductive film, which is provided on the top surface of the base-body portion, and the second portion thereby being formed as the second conductive film, which is on the bottom surface of the base-body portion.

4. The method of claim 3, wherein the testing the insulation characteristics is performed by applying the voltage between the first conductive film and the second conductive film by pressing a probe needle against the first conductive film provided at corners of the plurality of chip-forming areas or in the scribing lanes.

5. The method of claim 1, wherein:
the base-body portion includes a plurality of chip-forming areas demarcated by scribing lanes;
the first trench, the second trench, and the insulating film are provided in each of the plurality of chip-forming areas; and
the method further comprises dividing the first conductive film on the top surface of the base-body portion into a plurality of first conductive films respectively positioned in the plurality of chip-forming areas before the testing the insulation characteristics.

6. The method of claim 5, wherein the voltage is applied between one of the plurality of first conductive films and the second conductive film by pressing a probe needle against the one of the plurality of first conductive films at a corner of the chip-forming area in which the one of the plurality of first conductive films is positioned.

7. The method of claim 5, wherein:
each of the plurality of first conductive films includes a pad portion protruding from the chip-forming area into the scribing lane; and
the voltage is applied between one of the plurality of first conductive films and the second conductive film by pressing a probe needle against the pad portion of the one of the plurality of first conductive films.

8. A method for manufacturing a semiconductor device, comprising:

digging first and second trenches at a top surface of a plate-shaped base-body portion which includes a plurality of chip-forming areas demarcated by scribing lanes and a monitoring area positioned adjacent to the plurality of chip-forming areas and outside of the scribing lanes;

forming an insulating film in an inside of each of the first and second trenches;

laminating a continuous conductive film having a first portion laminated on the top surface of the base-body portion so as to bury the first and second trenches with the continuous conductive film via the insulating film and a second portion laminated on a bottom surface of the base-body portion;

dividing the continuous conductive film so as to separate the first and second portions from each other, the first portion thereby being formed as a first conductive film, which is provided on the top surface of the base-body portion, and the second portion thereby being formed as a second conductive film, which is on the bottom surface side of the base-body portion;

dividing the first conductive film provided on the top surface of the base-body portion into a plurality of first conductive films respectively positioned in the monitoring area and the plurality of chip-forming areas;

arranging the base-body portion on a test-stage so that the second conductive film faces and contacts the test-stage;

applying, by a power supply, a first voltage between the first conductive film positioned on the monitoring area and the test-stage which is electrically connected to a negative electrode side of the power supply, to confirm whether the second conductive film is electrically connected to the test-stage;

applying, by the power supply, a second voltage between the one of the plurality of first conductive films positioned on one of the plurality of chip-forming areas and the test-stage which is electrically connected to the negative electrode side of the power supply, to test insulation characteristics of the insulating film; and after applying the second voltage to test the insulation-characteristics, selectively removing the first conductive film from the top surface of the base-body portion, so as to define a gate electrode in the first trench and a separated-electrode in the second trench, the separated-electrode being separated from the gate electrode, wherein
the first trench, the second trench, and the insulating film are provided in the monitoring area and each of the plurality of chip-forming areas.

9. The method of claim 1, wherein the base-body portion is a semiconductor substrate obtained by a magnetic Czochralski method.

10. The method of claim 1, further comprising sequentially forming a buffer layer and a collector region on the bottom surface of the base-body portion after removing the second conductive film, the buffer layer and the collector region having differing impurities.

11. The method of claim 10, wherein the collector electrode is laminated on the bottom surface of the base-body portion after sequentially forming the buffer layer and the collector region on the bottom surface of the base-body portion.

12. A method for manufacturing a semiconductor device, comprising:
digging first and second trenches at a top surface of a plate-shaped base-body portion, the base-body portion including a plurality of chip-forming areas demarcated by scribing lanes and a monitoring area positioned adjacent to the plurality of chip-forming areas and outside of the scribing lanes, and the first trench, the second trench, and the insulating film being provided in the monitoring area and each of the plurality of chip-forming areas;

forming an insulating film in an inside of each of the first and second trenches;

laminating a conductive film on the top surface of the base-body portion so as to bury the first and second trenches with the conductive film via the insulating film;

before testing insulation characteristics of the insulating film:

dividing the conductive film on the top surface of the base-body portion into a plurality of conductive films respectively positioned in the monitoring area and the plurality of chip-forming areas, arranging the base-body portion on a test-stage so that the bottom surface of the base-body portion faces the test-stage, and applying a voltage for causing dielectric breakdown of the insulating film between the conductive film in the monitoring area and the bottom surface of the base-body portion;

testing the insulation characteristics of the insulating film by applying a voltage between the conductive film and a bottom surface of the base-body portion; and after the testing the insulation-characteristics, selectively removing the conductive film from the top surface of the base-body portion, so as to define a gate electrode in the first trench and a separated-electrode in the second trench, the separated-electrode being separated from the gate electrode.

* * * * *